(12) United States Patent
Kim et al.

(10) Patent No.: US 9,978,907 B2
(45) Date of Patent: May 22, 2018

(54) SEMICONDUCTOR ULTRAVIOLET LIGHT EMITTING DEVICE HAVING IMPROVED LIGHT EXTRACTION EFFICIENCY

(71) Applicant: SAMSUNG ELECTRONICS CO., LTD., Suwon-si (KR)

(72) Inventors: Jung Sub Kim, Hwaseong-si (KR); Dong Hyun Lee, Seoul (KR); Jin Sub Lee, Suwon-si (KR); Kyung Wook Hwang, Hwaseong-si (KR); In Su Shin, Incheon (KR); Eui Joon Yoon, Seoul (KR); Gun Do Lee, Seoul (KR); Jeong Hwan Jang, Busan (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days. days.

(21) Appl. No.: 15/147,039

(22) Filed: May 5, 2016

(65) Prior Publication Data

US 2017/0054055 A1 Feb. 23, 2017

(30) Foreign Application Priority Data

Aug. 18, 2015 (KR) .................. 10-2015-0116301

(51) Int. Cl.
*H01L 33/08* (2010.01)
*H01L 33/06* (2010.01)
(Continued)

(52) U.S. Cl.
CPC .............. *H01L 33/08* (2013.01); *H01L 33/06* (2013.01); *H01L 33/12* (2013.01); *H01L 33/20* (2013.01); *H01L 33/32* (2013.01)

(58) Field of Classification Search
CPC ......... H01L 33/06; H01L 33/08; H01L 33/32; H01L 33/20
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| (Continued) | | |

FOREIGN PATENT DOCUMENTS

| JP | 5439526 B2 | 3/2014 |
| KR | 10-1379341 B1 | 4/2014 |
| KR | 10-1391960 B1 | 5/2014 |

OTHER PUBLICATIONS

Michele Conroy et al., "Epitaxial lateral overgrowth of AlN on self-assembled patterned nanorods" Journal of Materials Chemistry C, 2015, 3, The Royal Society of Chemistry 2015 pp. 431-437.
(Continued)

*Primary Examiner* — Daniel Whalen
*Assistant Examiner* — Suberr Chi
(74) *Attorney, Agent, or Firm* — Sughrue Mion, PLLC

(57) ABSTRACT

A semiconductor ultraviolet light emitting device includes: a substrate; a buffer layer disposed on the substrate and comprising a plurality of nanorods between which a plurality of voids are formed; a first conductive nitride layer disposed on the buffer layer and having a first conductive AlGaN layer; an active layer disposed on the first conductive nitride layer and having a quantum well including $Al_xIn_yGa_{1-x-y}N$ ($0 \leq x+y \leq 1$, $0 \leq y < 0.15$); and a second conductive nitride layer disposed on the active layer and having a second conductive AlGaN layer, in which the plurality of nanorods satisfy $3.5 \leq n(\lambda) \times D/\lambda \leq 5.0$, where $\lambda$ represents a wavelength of light generated by the active layer, $n(\lambda)$ represents a refractive index of the plurality of nanorods at
(Continued)

a wavelength of λ, and D represents diameters of the plurality of nanorods.

13 Claims, 17 Drawing Sheets

(51) Int. Cl.
*H01L 33/12* (2010.01)
*H01L 33/20* (2010.01)
*H01L 33/32* (2010.01)

(56) References Cited

U.S. PATENT DOCUMENTS

| | | | |
|---|---|---|---|
| RE38,466 E | | 3/2004 | Inoue et al. |
| 6,818,465 B2 | | 11/2004 | Biwa et al. |
| 6,818,530 B2 | | 11/2004 | Shimoda et al. |
| 6,858,081 B2 | | 2/2005 | Biwa et al. |
| 6,967,353 B2 | | 11/2005 | Suzuki et al. |
| 7,002,182 B2 | | 2/2006 | Okuyama et al. |
| 7,084,420 B2 | | 8/2006 | Kim et al. |
| 7,087,932 B2 | | 8/2006 | Okuyama et al. |
| 7,154,124 B2 | | 12/2006 | Han et al. |
| 7,208,725 B2 | | 4/2007 | Sherrer et al. |
| 7,288,758 B2 | | 10/2007 | Sherrer et al. |
| 7,319,044 B2 | | 1/2008 | Han et al. |
| 7,501,656 B2 | | 3/2009 | Han et al. |
| 7,687,811 B2 * | | 3/2010 | Jang ............... H01L 33/20 257/84 |
| 7,709,857 B2 | | 5/2010 | Kim et al. |
| 7,759,140 B2 | | 7/2010 | Lee et al. |
| 7,777,241 B2 | | 8/2010 | Moustakas et al. |
| 7,781,727 B2 | | 8/2010 | Sherrer et al. |
| 7,790,482 B2 | | 9/2010 | Han et al. |
| 7,940,350 B2 | | 5/2011 | Jeong |
| 7,959,312 B2 | | 6/2011 | Yoo et al. |
| 7,964,881 B2 | | 6/2011 | Choi et al. |
| 7,985,976 B2 | | 7/2011 | Choi et al. |
| 7,994,525 B2 | | 8/2011 | Lee et al. |
| 8,008,683 B2 | | 8/2011 | Choi et al. |
| 8,013,352 B2 | | 9/2011 | Lee et al. |
| 8,049,161 B2 | | 11/2011 | Sherrer et al. |
| 8,129,711 B2 | | 3/2012 | Kang et al. |
| 8,143,647 B2 | | 3/2012 | Chua et al. |
| 8,179,938 B2 | | 5/2012 | Kim |
| 8,263,987 B2 | | 9/2012 | Choi et al. |
| 8,324,646 B2 | | 12/2012 | Lee et al. |
| 8,399,944 B2 | | 3/2013 | Kwak et al. |
| 8,432,511 B2 | | 4/2013 | Jeong |
| 8,459,832 B2 | | 6/2013 | Kim |
| 8,502,242 B2 | | 8/2013 | Kim |
| 8,536,604 B2 | | 9/2013 | Kwak et al. |
| 8,659,031 B2 | | 2/2014 | Kim |
| 8,735,931 B2 | | 5/2014 | Han et al. |
| 8,766,295 B2 | | 7/2014 | Kim |
| 2010/0176416 A1 * | | 7/2010 | Kim ............... H01L 33/22 257/98 |
| 2013/0181242 A1 * | | 7/2013 | Cho ............... H01L 51/0096 257/98 |
| 2014/0225121 A1 | | 8/2014 | Bae et al. |

OTHER PUBLICATIONS

Kentaro Nagamatsu et al., "High-efficiency AlGaN-based UV light-emitting diode on laterally overgrown AlN", Elsevier, Journal of Crystal Growth 310, (2008) pp. 2326-2329 doi :10.1016/j.jcrysgro.2007.11.152.

* cited by examiner

SEMICONDUCTOR ULTRAVIOLET LIGHT EMITTING DEVICE HAVING IMPROVED LIGHT EXTRACTION EFFICIENCY

CROSS-REFERENCE TO RELATED APPLICATION

This application claims the priority and benefit of Korean Patent Application No. 10-2015-0116301, filed on Aug. 18, 2015, in the Korean Intellectual Property Office, the disclosure of which is incorporated herein in its entirety by reference.

BACKGROUND

Apparatuses consistent with exemplary embodiments relate to a semiconductor ultraviolet light emitting device.

Recently, ultraviolet light sources have been used in a range of devices for various purposes, such as sterilization and disinfection devices, UV curing devices, and the like. For example, nitride semiconductor ultraviolet light emitting diodes (LEDs) may be used as the ultraviolet light sources.

However, a semiconductor mainly used in an ultraviolet light emitting device, such as aluminum nitride (AlN), is prone to crystal defects, and thus it may be difficult to obtain a high-quality crystal structure. Meanwhile, since ultraviolet light has a high degree of energy, ultraviolet light may be easily absorbed by a semiconductor, and light extraction efficiency thereof may be relatively low.

SUMMARY

Exemplary embodiments of the inventive concept provide a semiconductor ultraviolet light emitting device having improved light extraction efficiency and excellent crystal quality.

According to an exemplary embodiment, there is provided a semiconductor ultraviolet light emitting device, the device may include: a substrate; a buffer layer disposed on the substrate and comprising a plurality of nanorods between which a plurality of voids are formed; a first conductive nitride layer disposed on the buffer layer and having a first conductive AlGaN layer; an active layer disposed on the first conductive nitride layer and having a quantum well including $Al_xIn_yGa_{1-x-y}N$ ($0 \le x+y \le 1$, $0 \le y < 0.15$); and a second conductive nitride layer disposed on the active layer and having a second conductive AlGaN layer, in which the plurality of nanorods satisfy $3.5 \le n(\lambda) \times D/\lambda \le 5.0$, where $\lambda$ represents a wavelength of light generated by the active layer, $n(\lambda)$ represents a refractive index of the plurality of nanorods at a wavelength of $\lambda$, and D represents diameters of the plurality of nanorods.

The buffer layer may include a first aluminum nitride (AlN) layer having the plurality of nanorods arranged on the substrate and a second AlN layer disposed on the first AlN layer comprising the voids between the plurality of nanorods.

The first AlN layer may further include an AlN film disposed on the substrate, and the plurality of nanorods may be arranged on the AlN film.

The second AlN layer may be obtained from upper surfaces of the nanorods by an epitaxial lateral overgrowth (ELO) process, and the void positioned between the plurality of nanorods may be maintained to be empty.

The first AlN layer may include nanorods having a three-dimensional structure, and the second AlN layer may have a plate shape.

The plurality of nanorods may be arranged to contact an upper surface of the substrate.

A wavelength $\lambda$ of light generated by the active layer may range from about 250 nm to 300 nm.

In this case, diameters D of the plurality of nanorods may range from about 450 nm to 650 nm. Heights H of the plurality of nanorods may range from about 200 nm to 2 μm. Pitches P of the plurality of nanorods may be greater than or equal to the diameters D of the nanorods, and may be less than about 3 μm. An interval d between two adjacent nanorods may be less than about 200 nm.

The plurality of nanorods may be arranged in a hexagonal closet packing (HCP) arrangement.

The quantum well may include a plurality of quantum well layers including $Al_{x1}Ga_{1-x1}N$ ($0 < x1 < 1$), and the active layer may include the plurality of quantum well layers and a plurality of quantum barrier layers including $Al_{x2}Ga_{1-x2}N$ ($x1 < x2 < 1$), which are alternately stacked.

According to another aspect of an exemplary embodiment, there is provided a semiconductor ultraviolet light emitting device, the device may include: a substrate; a nitride layer disposed on the substrate, including a plurality of nanostructures between which a plurality of voids are formed, and containing aluminum (Al); a first conductive nitride layer disposed on the nitride layer; an active layer disposed on the first conductive nitride layer and having a quantum well including $Al_xIn_yGa_{1-x-y}N$ ($0 \le x+y \le 1$, $0 \le y < 0.15$); and a second conductive nitride layer disposed on the active layer, in which a distance d between the plurality of nanostructures is less than about 200 nm.

The nitride layer may include a first nitride layer having the plurality of nanorods arranged on the substrate, and a second nitride layer disposed on the first nitride layer comprising the voids formed between the plurality of nanorods and containing aluminum (Al).

A wavelength $\lambda$ of light generated by the active layer ranges from about 250 nm to 300 nm, and widths D of the plurality of nanostructures range from about 450 nm to 650 nm.

The plurality of nanostructures may have a column shape of which an area of a lower surface is greater than or equal to that of an upper surface. For example, the plurality of nanostructures may be cylindrical.

A portion of the substrate may be exposed by the void positioned between the plurality of nanostructures.

According to another aspect of an exemplary embodiment, there is provided a semiconductor light emitting device, the device may include: a substrate; a buffer layer disposed on the substrate and comprising a plurality of nanorods between which a plurality of voids are formed; a first conductive layer disposed on the buffer layer; an active layer disposed on the first conductive layer; and a second conductive layer disposed on the active layer.

BRIEF DESCRIPTION OF DRAWINGS

The above and other aspects, features, and advantages of the disclosure will be more clearly understood from the following detailed description taken in conjunction with the accompanying drawings, in which.

DETAILED DESCRIPTION OF THE EXEMPLARY EMBODIMENTS

Figure 1:
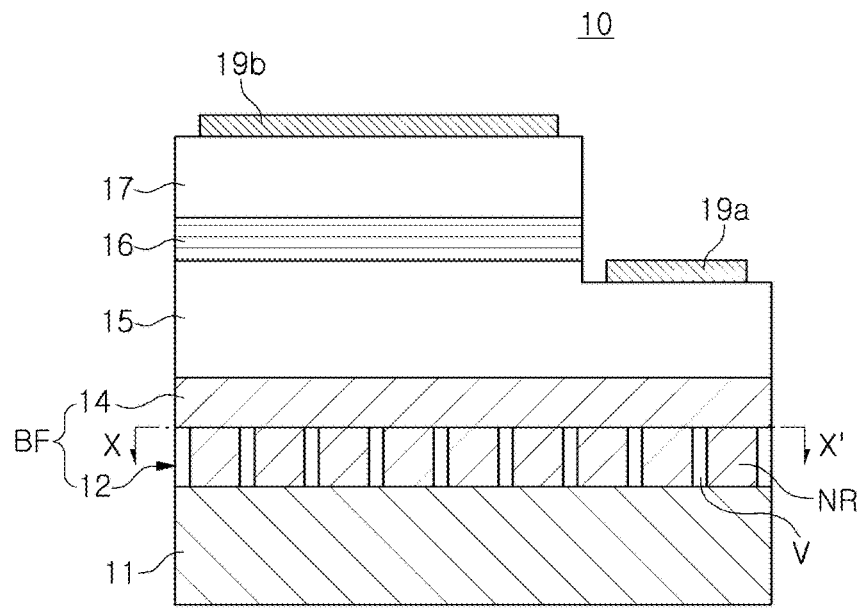
FIG. 1 is a cross-sectional view of a semiconductor ultraviolet light emitting device according to an exemplary embodiment.

Various exemplary embodiments of the inventive concept will be described more fully with reference to the accompanying drawings.

The inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art.

It will be understood that when an element, such as a wafer, layer, region or substrate, is referred to as being "on," "connected to," or "coupled to" another element, it can be directly "on," "connected to," or "coupled to" the other element or intervening elements may be present. In contrast, when an element is referred to as being "directly on," "directly connected to," or "directly coupled to" another element, there may be no intervening elements or layers present. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the inventive concept will be described with reference to schematic views illustrating embodiments of the inventive concept. In the drawings, for example, due to manufacturing techniques and/or tolerances, modifications of the shape shown may be estimated. Thus, embodiments of the inventive concept should not be construed as being limited to the particular shapes of regions shown herein, for example, to include a change in shape results in manufacturing. The following embodiments may also be constituted as one or a combination thereof.

The exemplary embodiments of the inventive concept described below may have a variety of configurations and propose only a required configuration herein, but are not limited thereto.

Figure 2:
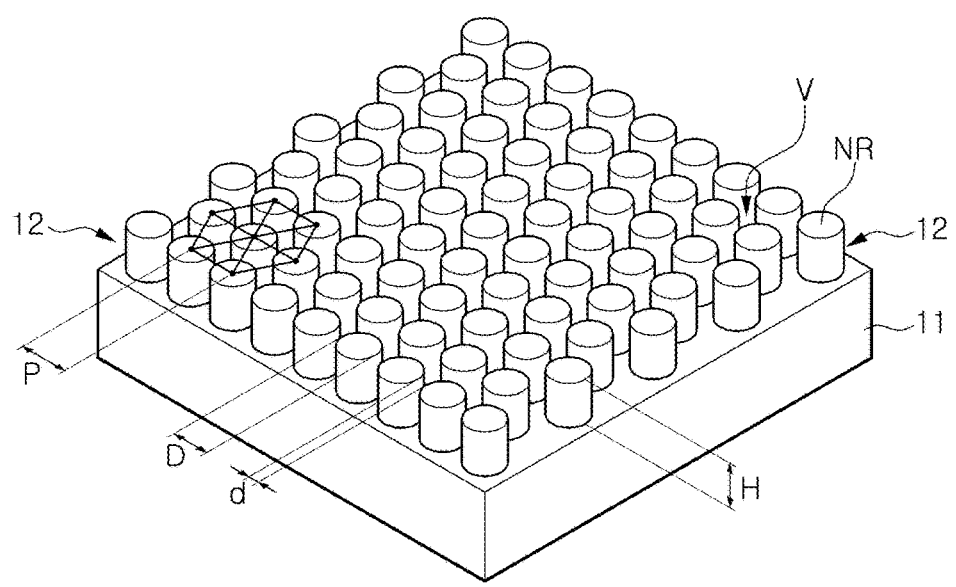
FIG. 2 is a schematic perspective view illustrating a nanorod arrangement of the semiconductor ultraviolet light emitting device illustrated in FIG. 1.

FIG. 1 is a cross-sectional view illustrating a semiconductor ultraviolet light emitting device according to an exemplary embodiment, and FIG. 2 is a schematic perspective view illustrating a nanorod arrangement taken along line X-X' of the semiconductor ultraviolet light emitting device illustrated in FIG. 1.

Referring to FIG. 1, a semiconductor ultraviolet light emitting device 10 may include a substrate 11, and a buffer layer BF, a first conductive nitride layer 15, an active layer 16, and a second conductive nitride layer 17, sequentially disposed on the substrate 11

The substrate 11 may be provided as a semiconductor growth substrate and may be formed of an insulating, conductive, or semi-conductive material, such as sapphire, silicon (Si), SiC, $MgAl_2O_4$, MgO, $LiAlO_2$, $LiGaO_2$, or GaN. The sapphire may have a lattice constant of 13.001 Å in a c-axis orientation, and 4.758 Å in an a-axis orientation, and have a C-plane (0001), an A-plane (11-20), and an R-plane (1-102). In this case, the C-plane is mainly used as a nitride growth substrate because it facilitates the growth of a nitride thin film and is stable at high temperatures.

Meanwhile, although not shown in the drawings, a plurality of unevenness structures may be formed on an upper surface of the substrate 11, such as a growth surface of semiconductor layers. Such unevenness structures may increase crystallinity, light emitting efficiency, and the like of semiconductor layers disposed on an upper portion thereof.

The buffer layer BF employed in the exemplary embodiment may include a first AlN layer 12 and a second AlN layer 14 disposed on the first AlN layer 12. While the first AlN layer 12 may include nanorods NR having a three-dimensional structure, the second AlN layer 14 may have a plate shape.

The first AlN layer 12 may include a plurality of nanorods NR disposed on the substrate 11, and the plurality of nanorods NR may be arranged to have voids V therebetween. The first AlN layer 12 may be understood as being a porous AlN film. As illustrated in FIG. 2, the plurality of nanorods NR may be cylindrical, and may be arranged in a hexagonal closet packing (HCP) structure. The term "nanorod" used in the exemplary embodiment may refer to a structure having a width (or diameter) less than about 1 μm and having a column shape.

The second AlN layer 14 may be disposed on the first AlN layer 12. The second AlN layer 14 may be obtained from upper surfaces of the nanorods NR by an epitaxial lateral overgrowth (ELO) process. In a process of growing the second AlN layer 14, the voids V positioned between the plurality of nanorods NR may be maintained to be empty. As such, crystal defects may be significantly reduced through epitaxial lateral overgrowth. Thus, the second AlN layer 14 having high-quality crystals may be formed, and crystallinity of semiconductor layers (particularly, active layer 16) to be subsequently grown on the second AlN layer 14 may be greatly increased.

The first conductive nitride layer 15 may be an n-type nitride semiconductor layer satisfying $Al_xIn_yGa_{1-x-y}N$ ($0<x\leq1$, $0\leq y<1$), and an n-type impurity may be silicon (Si) or carbon (C). For example, the first conductive nitride layer 15 may contain an n-type AlGaN. The second conductive nitride layer 17 may be a p-type nitride semiconductor layer satisfying $Al_xIn_yGa_{1-x-y}N$ ($0\leq x\leq1$, $0\leq y<1$). A p-type impurity may be magnesium (Mg). For example, the second conductive nitride layer 17 may contain undoped AlGaN. In a certain example, the second conductive nitride layer 17 may be a nitride semiconductor intentionally undoped as a pseudo p-type semiconductor.

The semiconductor ultraviolet light emitting device 10 may further include a first electrode 19a and a second electrode 19b respectively connected to the first conductive nitride layer 15 and the second conductive nitride layer 17. According to the exemplary embodiment, the first electrode 19a may be disposed in an area of the first conductive nitride layer 15 exposed by a mesa etching process.

The active layer 16 may include a quantum well including $Al_xIn_yGa_{1-x-y}N$ ($0\leq x+y\leq1$, $0\leq y<0.15$). For example, the quantum well may be a single quantum well (SQW) structure having a quantum well layer including $Al_xGa_{1-x}N$ ($0<x<1$). Alternatively, the active layer 16 may be a multi-quantum well (MQW) structure in which a plurality of quantum well layers including $Al_{x1}Ga_{1-x1}N$ ($0<x1<1$) and a plurality of quantum barrier layers including $Al_{x2}Ga_{1-x2}N$ ($x1<x2<1$) are alternately stacked.

The active layer 16 of the semiconductor ultraviolet light emitting device 10 may emit short-wavelength ultraviolet light. For example, the active layer 16 may be light having a wavelength ranging from about 200 nm to 430 nm. In a certain example, light emitted from the active layer 16 may have a wavelength ranging from about 200 nm to 430 nm, and may further range from about 250 nm to 300 nm.

The ultraviolet light may be absorbed by a semiconductor (particularly, a semiconductor having a small band gap). For example, GaN may absorb light having a wavelength less than or equal to about 360 nm, and thus, light loss may occur. Therefore, the semiconductor ultraviolet light emitting device 10 may be formed by using a nitride layer containing aluminum (Al), such as AlN, AlGaN, and the like.

In addition, the buffer layer BF employed in the exemplary embodiment may include the first AlN layer 12 as a light extraction structure that may increase efficiency of the semiconductor ultraviolet light emitting device 10. The first AlN layer 12 may have a structure in which two elements (the plurality of nanorods NR and the plurality of voids V) having different respective refractive indexes are arranged to intersect each other, thereby significantly increasing the extraction efficiency of ultraviolet light.

In the first AlN layer 12, a size and an arrangement of each of the plurality of nanorods NR may be determined according to conditions for improving ultraviolet light efficiency. As illustrated in FIG. 2, the size of the nanorod NR may be represented by a diameter D and a height H. The arrangement of the nanorods NR may be represented by a pitch P that is a distance between centers of two adjacent nanorods, and an interval d between the two adjacent nanorods. In a certain example, the nanorods NR may be arranged in such a manner that the interval d between the two adjacent nanorods is 0. In this case, since the nanorods NR may have a cylindrical structure, a void V may be formed between a plurality of nanorod sets, each having three adjacent nanorods.

If a refractive index of the plurality of nanorods NR at a wavelength λ of light generated by the active layer 16 is defined as n(λ), the diameters D of the plurality of nanorods NR satisfy $3.5 \leq n(\lambda) \times D/\lambda \leq 5.0$. For example, the diameters D of the plurality of nanorods NR may range from about 450 nm to 650 nm.

The heights H of the plurality of nanorods NR may range from about 200 nm to 2 μm. In order to additionally increase light extraction efficiency, as in the exemplary embodiment, a portion of the substrate 11 may be exposed by the voids V. The pitch P between two adjacent nanorods may be greater than or equal to the diameter D of each nanorod, and may be less than about 3 μm.

Meanwhile, the interval d between two adjacent nanorods may be adjusted to readily merge AlN regrown from the upper surfaces of the nanorods NR. For example, the interval d between two adjacent nanorods may be less than about 200 nm. Since a diffusion length of an Al atom is short in comparison to other elements, the interval d between two adjacent nanorods may be set to be less than or equal to about 150 nm in a certain example.

The first AlN layer 12 having the voids V may function as a buffer layer enhancing structural stability of the semiconductor ultraviolet light emitting device 10. In particular, even when an external impact is applied to a wafer before the wafer is cut into chips, the first AlN layer 12 having the voids V may effectively prevent mechanical damage such as cracks from being generated.

The nanorods may be nanostructures having various forms. For example, the nanorods may be different polygonal columns, such as hexagonal columns. As another example, the nanorods may be nanostructures having various shapes, of which an average width or a width at a central portion is less than about 1 µm, and the nanorods may be arranged to have a void between adjacent nanostructures. For example, each of the nanorods may have a column shape of which an area of a lower surface may be greater than or equal to that of an upper surface.

Figure 3:
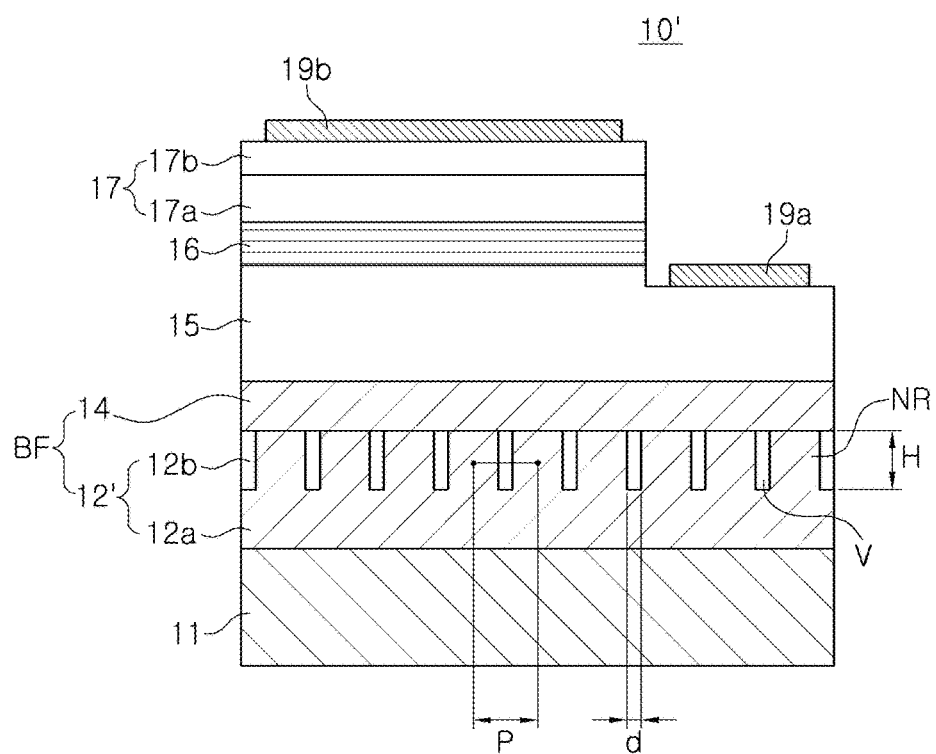
FIG. 3 is a cross-sectional view illustrating a semiconductor ultraviolet light emitting device according to an exemplary embodiment.

FIG. 3 is a cross-sectional view illustrating a semiconductor ultraviolet light emitting device according to an exemplary embodiment.

Referring to FIG. 3, similar to the semiconductor ultraviolet light emitting device 10 of FIG. 1, a semiconductor ultraviolet light emitting device 10' may include a substrate 11, a buffer layer BF, a first conductive nitride layer 15, an active layer 16, and a second conductive nitride layer 17.

The buffer layer BF employed in the exemplary embodiment may include a first AlN layer 12' and a second AlN layer 14 disposed on the first AlN layer 12'. The first AlN layer 12' may be a layer having a three-dimensional pattern. As illustrated in FIG. 3, the first AlN layer 12' may include a base layer 12a disposed on the substrate 11, and pattern areas 12b disposed on the base layer 12a and including nanorods NR. The base layer 12a may be an AlN film. By forming AlN crystals having a thickness corresponding to that of the first AlN layer 12' and selectively etching the AlN crystals to a predetermined depth H, patterned nanorods NR may be obtained.

Conditions of sizes and arrangements of the nanorods NR may be similar to the conditions described in the semiconductor ultraviolet light emitting device 10 of FIG. 1. In order to increase light extraction efficiency, diameters D of the plurality of nanorods NR may satisfy $3.5 \leq n(\lambda) \times d/\lambda \leq 5.0$. For example, the diameters D of the plurality of nanorods NR may range from about 450 nm to 650 nm.

Heights H of the plurality of nanorods NR may range from about 200 nm to 2 µm. A pitch P of two adjacent nanorods may be greater than or equal to a diameter D of each nanorod, and may be less than 3 µm. An interval d between the two adjacent nanorods may be set to be less than about 200 nm, and may further be about 150 nm or less.

The second AlN layer 14 may have a plate shape. The second AlN layer 14 may be disposed on the first AlN layer 12'. By merging AlN crystals regrown from upper surfaces of the nanorods NR, a planarized second AlN layer 14 may be obtained. In this growth process, voids V between the plurality of nanorods NR may be maintained to be empty to be utilized as light extraction elements along with the nanorods NR.

As illustrated in FIG. 3, the second conductive nitride layer 17 employed in the exemplary embodiment may include a p-type AlGaN layer 17a and a p-type GaN contact layer 17b. The p-type AlGaN layer 17a may have a plurality of layers having different respective Al contents. Similar to this, the first conductive nitride layer 15 may include a single layer, but may also have a plurality of layers having different characteristics, such as a doping concentration, a composition, and the like. For example, at least one of the first and second conductive nitride layers 15 and 17 may have a super lattice structure in which a plurality of layers having different band gap energy are stacked alternately and repeatedly.

FIGS. 4A through 4E are cross-sectional views respectively illustrating a nanorod formation processes employable in a method of manufacturing the semiconductor ultraviolet light emitting device illustrated in FIG. 1.

Figure 4A:
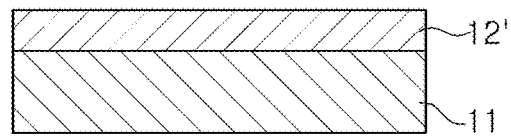
FIGS. 4A through 4E are cross-sectional views respectively illustrating nanorod formation processes employable in a method of manufacturing the semiconductor ultraviolet light emitting device illustrated in FIG. 1.

First, as illustrated in FIG. 4A, the first AlN layer 12' may be grown on the substrate 11.

The substrate 11 may be a sapphire substrate as a substrate for semiconductor growth. The first AlN layer 12' may be grown considering required heights of nanorods. Although not limited thereto, a thickness of the first AlN layer 12' may range from about 0.1 µm to about 2 µm. As described above, ultraviolet light may be absorbed by a semiconductor (particularly, a semiconductor having a small band gap), and thus, in order to prevent this, the buffer layer may be formed by using a nitride layer including another composition containing Al, such as AlGaN, other than AlN.

Figure 4B:
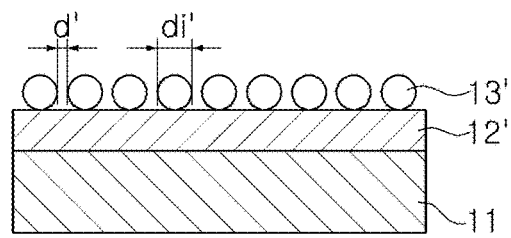

As illustrated in FIG. 4B, nanobeads 13' may be arranged on the first AlN layer 12'.

The term "nanobead" used in this process may indicate spherical particles having a maximum diameter of about 1 µm. For example, the nanobeads 13' may be silica nanobeads. The nanobeads 13' may be used as an etching mask to form a nanoscale fine pattern. A desired diameter di of each of the nanorods 13 and a desired interval d (or a pitch) between two adjacent nanorods may be determined by a diameter di' of each of the nanobeads 13' and an arrangement interval d' between the two adjacent nanobeads. A required arrangement of the nanobeads 13' may be formed by spin coating. The arrangement interval d' between the two adjacent nanobeads may adjust the size and density of the nanobeads 13' and a concentration of a solution.

Figure 4C:
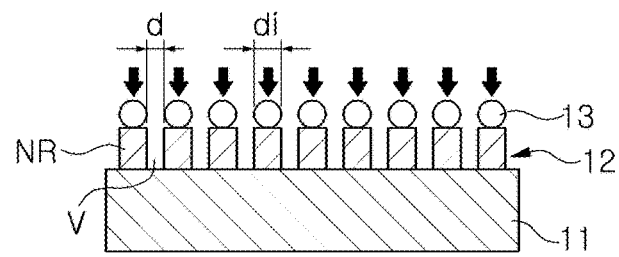
Figure 4D:
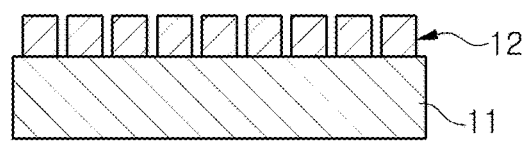

Next, as illustrated in FIG. 4C, the first AlN layer may be patterned by using the nanobeads 13. After the patterning process, the nanobeads 13 may be removed from the plurality of nanorods NR as illustrated in FIG. 4D.

By this patterning process, the first AlN layer 12 in which the nanorods NR are arranged may be formed. The patterning process may be performed using dry etching, and the nanobeads 13 may be used as a mask. A portion of an outer circumference of each of the nanobeads 13 may be damaged to have a slightly reduced diameter di in the etching step. The diameter of the nanorods NR obtained in this process may correspond to the reduced diameter di of the nanobeads 13, and the interval d between the two adjacent nanorods may also be slightly larger than the interval d' between the two adjacent nanobeads before the etching. The interval d may be additionally adjusted by controlling conditions of the etching process. After the etching process is finished, the nanobeads may be removed from the plurality of nanorods NR using a selective etching process and then a cleaning and drying process may be applied.

Figure 4E:
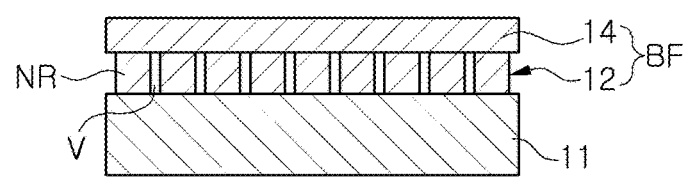

Next, as illustrated in FIG. 4E, the second AlN layer 14 may be grown on the nanorods NR.

The second AlN layer 14 may be formed by regrowing AlN on the upper surfaces of the nanorods NR in the first AlN layer 12. This process may allow the AlN to be regrown under a condition in which epitaxial lateral overgrowth is enhanced from the upper surfaces of the nanorods NR, and regrown portions of the AlN to be merged with each other, thereby obtaining a relatively planarized second AlN layer 14. In this process, the voids V positioned between the nanorods NR may be maintained to be empty. Subsequently, as illustrated in FIG. 1, a required semiconductor ultraviolet light emitting device 10 may be manufactured by sequentially growing the first conductive nitride layer 15, the active layer 16, and the second conductive nitride layer 17 on the second AlN layer 14.

As in the exemplary embodiments, in the case of growing the nitride layer containing Al, since the Al atom has a relatively short diffusion length on a surface of the nitride layer, it may be preferred that a pattern interval is small for merging through epitaxial lateral overgrowth. For example, the pattern interval, i.e., an interval between two adjacent nanorods, may be less than or equal to about 200 nm, and may further be about 150 nm or less. Such a fine pattern process may be performed by a photolithography process other than the above-mentioned process using the nanobeads.

Hereinafter, simulation results in which a finite difference time domain (FDTD) simulation is performed to confirm effects according to the conditions of the sizes and arrangement of the nanostructures will be explained. The simulation results may include: (i) light extraction efficiency according to a diameter of nanorod; (ii) light extraction efficiency according to correlation between diameter and wavelength of nanorod; (iii) light extraction efficiency according to a pitch of nanorod; and (iv) light extraction efficiency according to a height of nanorod.

Figure 5:
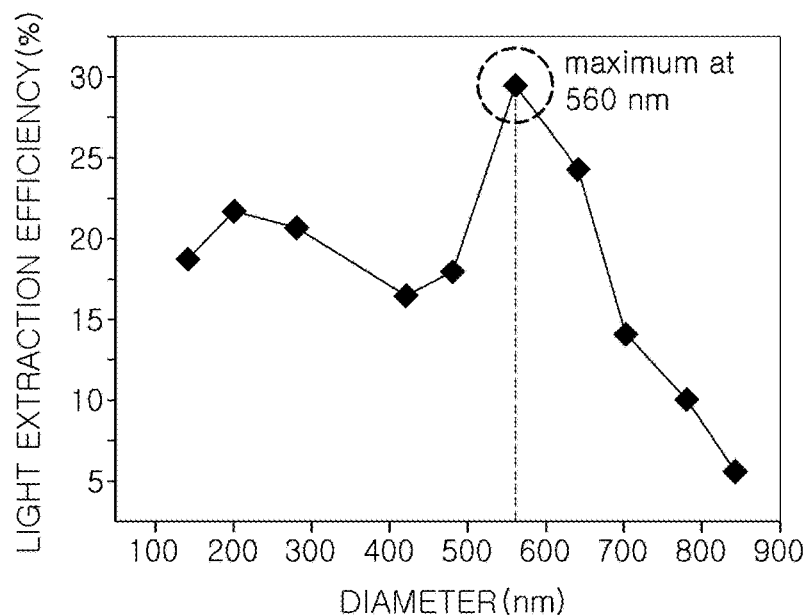
FIG. 5 is a graph illustrating a change in light extraction efficiency depending on diameters of nanorods.

FIG. 5 is a graph illustrating a change in light extraction efficiency depending on diameters of nanorods. For example, FIG. 5 shows the simulation result of (i) light extraction efficiency according to a diameter of nanorod.

In order to confirm effects of light extraction improvement of an AlN layer according to a diameter of nanorods, light extraction efficiency of ultraviolet light having a wavelength of 280 nm was measured in a structure similar to that of the semiconductor ultraviolet light emitting device 10 illustrated in FIG. 1 while changing the diameter of the nanorods from 100 nm to 900 nm under identical measurement conditions.

Light extraction efficiency increased as compared to light extraction efficiency measured while nanorods are not provided is illustrated in FIG. 5.

It is confirmed that light extraction efficiency is slightly increased or decreased when the diameter of the nanorods is in a range of a maximum of 450 nm, and is significantly increased when the diameter of the nanorods is in a range of about 450 nm to 650 nm. In this range, it can be seen that effects of light extraction improvement increase from 16% to 28%. It can be seen that light extraction efficiency is most significantly increased when the diameter of the nanorods is 560 nm, which is twice of the ultraviolet light emitting device having light emission wavelengths of 280 nm. Light extraction efficiency can be gradually decreased when the diameter of the nanorods exceeds 650 nm.

Figure 6:
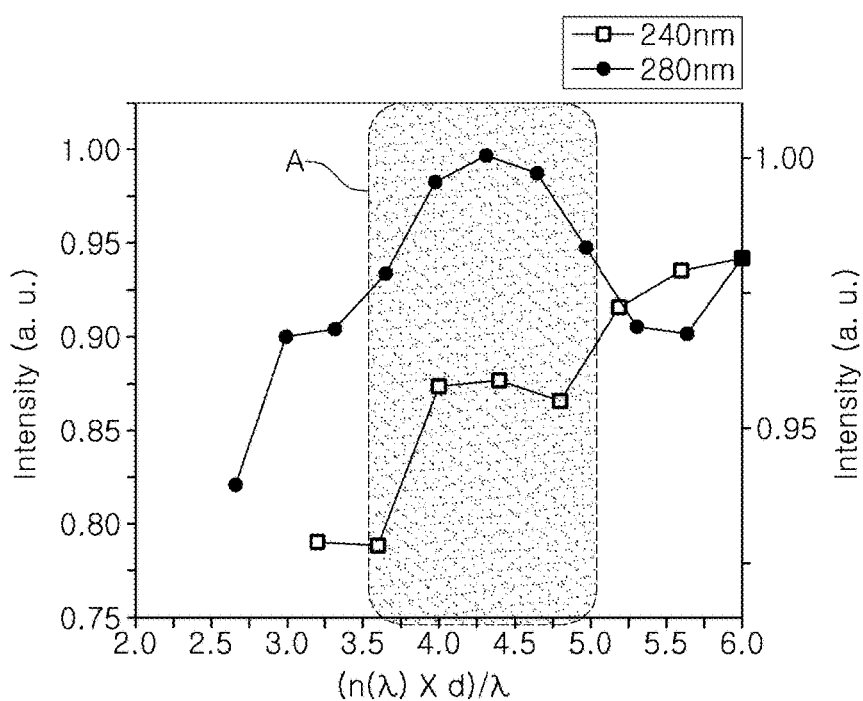
FIG. 6 is a graph illustrating a change in light extraction efficiency depending on a correlation between diameters and wavelengths of nanorods.

FIG. 6 is a graph illustrating a change in light extraction efficiency depending on a correlation between diameter and wavelength of nanorods. For example, FIG. 6 shows the simulation result of (ii) light extraction efficiency according to a correlation between diameter and wavelength of nanorod.

Since light extraction efficiency depends on light emission wavelengths, effects of light extraction efficiency improvement according to a correlation between light emission wavelengths in an ultraviolet light band and diameter of nanorods are confirmed.

For ultraviolet light emitting devices having light emission wavelengths of 240 nm and 280 nm, respectively, an interval d between two adjacent nanorods is fixed to 100 nm, and changes in light output efficiency for the diameter of the nanorods are measured.

A relational expression between the diameter D of the nanorods and light emission wavelengths ($\lambda$) of an active layer is defined as $n(\lambda) \times D/\lambda$, and light extraction efficiency according to values of the relational expression is illustrated in FIG. 6.

As illustrated in FIG. 6, light extraction efficiency is maximized when the values of the relational expression correspond to area A, i.e., a range of 3.5 to 5.0 for ultraviolet light having a wavelength of 280 nm and ultraviolet light having a wavelength of 240 nm. Accordingly, light extraction efficiency is significantly increased under a condition that the diameter D of the nanorods is satisfied $3.5 \leq n(\lambda) \times D/\lambda \leq 5.0$ in the ultraviolet light band.

Figure 7:
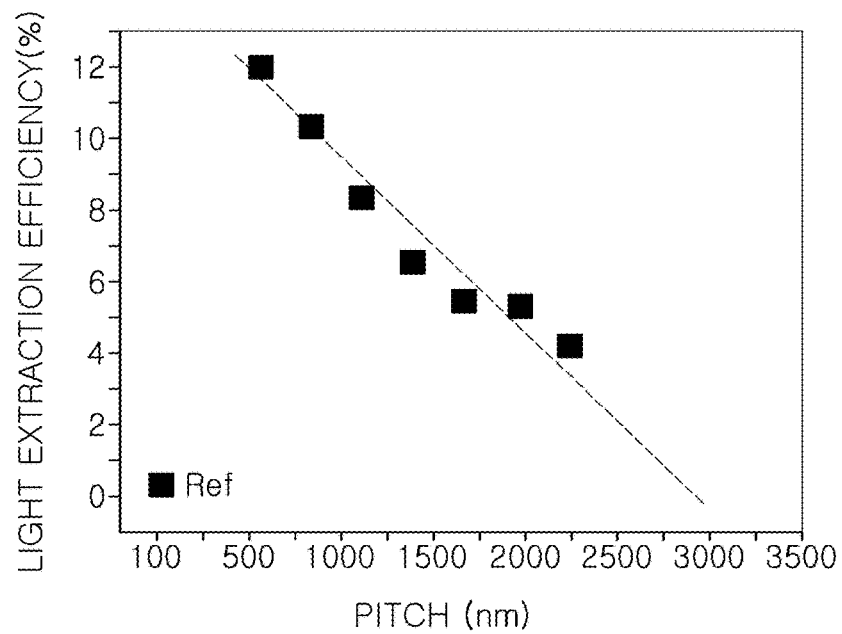
FIG. 7 is a graph illustrating a change in light extraction efficiency depending on pitches of nanorods.

FIG. 7 is a graph illustrating a change in light extraction efficiency depending on a pitch of two adjacent nanorods. For example, FIG. 7 shows the simulation result of (iii) light extraction efficiency according to a pitch of two adjacent nanorod.

In order to confirm changes in light extraction efficiency according to a pitch P of two adjacent nanorods, light extraction efficiency of ultraviolet light having a wavelength of 280 nm was measured in a structure similar to that of the semiconductor ultraviolet light emitting device 10 illustrated in FIG. 1 while changing the pitch P of the two adjacent nanorods from 560 nm to 2240 nm, each of the nanorods having a 560 nm diameter and a 800 nm height. The results are illustrated in FIG. 7. In FIG. 7, light extraction efficiency of an example in which nanorods are not provided is marked as Ref.

Referring to FIG. 7, it can be seen that the shorter an interval between two adjacent nanorods is the higher light extraction efficiency is. In particular, in the case that the nanorods are arranged in a hexagonal closet packing (HCP) arrangement so as to contact each other, light extraction efficiency can be maximized. It can be seen that light extraction efficiency is generally reduced when the interval between the two adjacent nanorods is increased, and is reduced since an air gap by voids is excessively increased on a single plane when the interval is about 3 μm or more.

Figure 8:
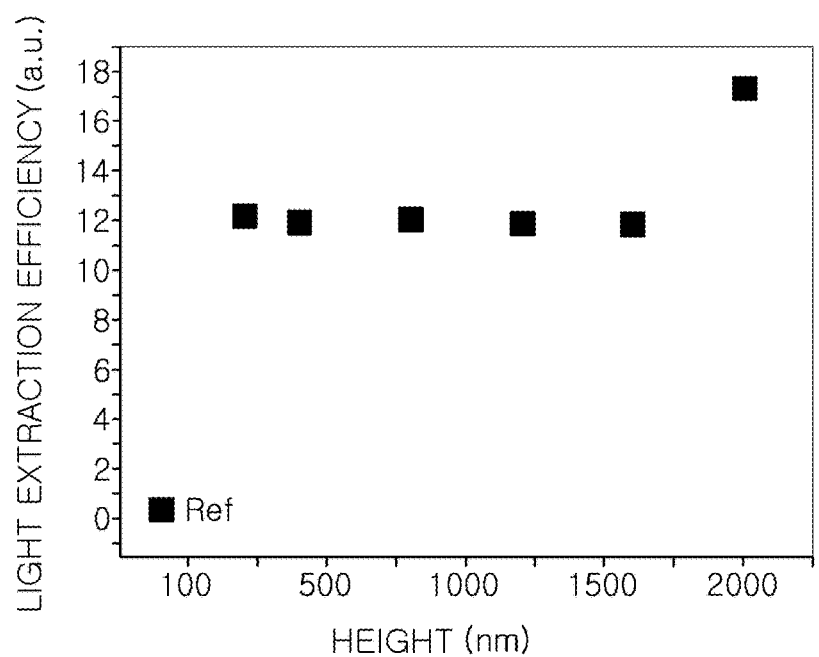
FIG. 8 is a graph illustrating a change in light extraction efficiency depending on heights of nanorods.

FIG. 8 is a graph illustrating a change in light extraction efficiency depending on a height of nanorods. For example, FIG. 8 shows the simulation result of (iv) light extraction efficiency according to a height of nanorod.

An AlN layer in which nanorods are to be formed is formed in such a manner that nanorods having an identical diameter are arranged after the AlN is grown to have a thickness of 2 μm, and the nanorods are formed to have a height ranging from 200 nm to 2,000 nm (etching to a substrate) by varying an etching time, and then light extraction efficiency is measured. The results are illustrated in FIG. 8.

Referring to FIG. 8, when the height of the nanorods is in a range of 200 nm to 1,600 nm, a similar degree of light extraction efficiency is shown, but light extraction efficiency is significantly increased in the case of etching to the substrate (2,000 nm).

According to the above-mentioned simulation results, it was confirmed that when the interval between the two adjacent nanorods and the diameter of the nanorods are 60 nm and 560 nm, respectively, in a wavelength of 280 nm, light extraction efficiency was maximized, and light extraction efficiency was increased up to 29% for a porous AlN layer as a buffer layer as compared to a structure (Ref) in which nanorods were not provided.

Hereinafter, an experimental example of nanorod formation and buffer layer formation will be explained.

In view of the above-mentioned simulation results, an AlN layer was grown to have a thickness of 1.3 μm on a sapphire substrate, and AlN nanorods were formed to have a 60 nm interval and a 560 nm diameter by an etching process using nanobeads.

Figure 9:
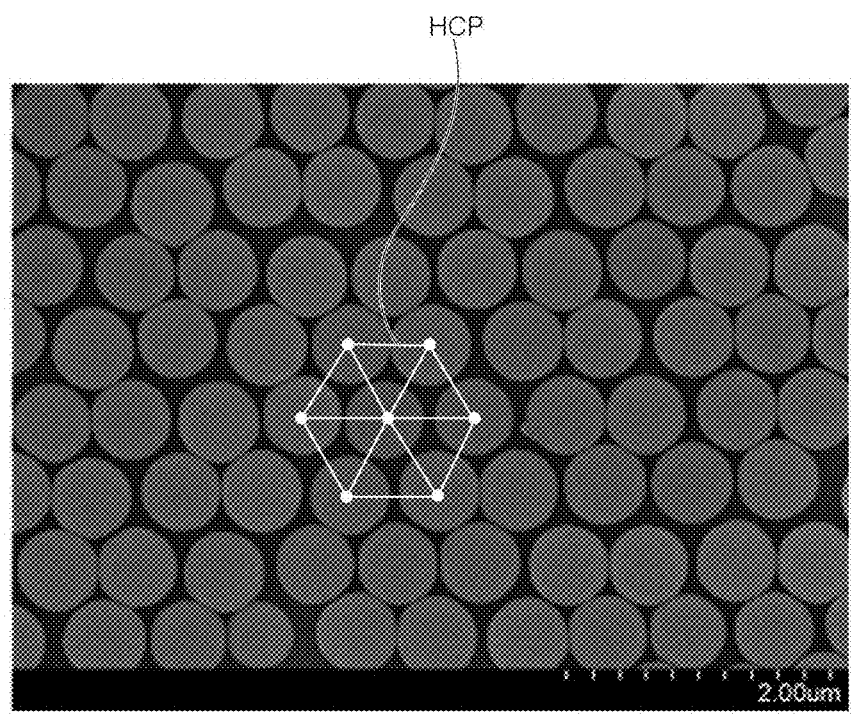
FIG. 9 is a scanning electron microscopy (SEM) picture obtained by imaging silica nanobeads arranged on an AlN layer.
Figure 10A:
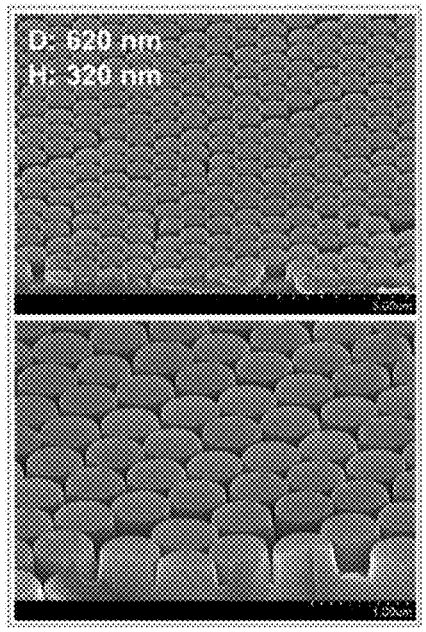
FIGS. 10A through 10D are SEM pictures obtained by imaging nanorods manufactured by using silica nanobeads, respectively.
Figure 10B:
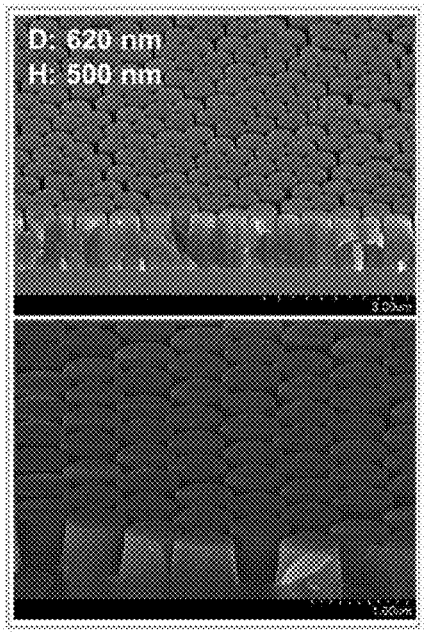
Figure 10C:
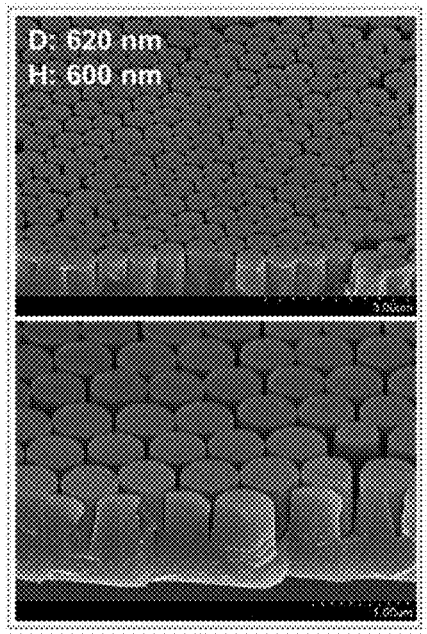
Figure 10D:
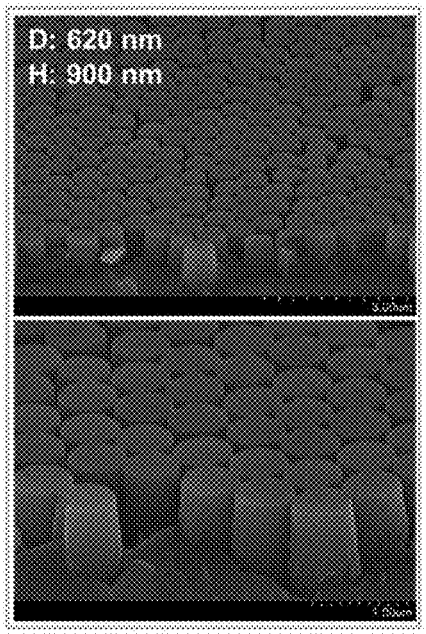

In more detail, silica nanobeads having a diameter of about 630 nm were composed, and the silica nanobeads were spin-coated on the AlN layer formed on the sapphire substrate to be used as a dry etching mask. A Size of the nanobeads and a concentration of a solution were adjusted, and as illustrated in FIG. 9, the nanobeads were arranged on the AlN layer in an HCP arrangement.

As illustrated in FIGS. 10A through 10D, a height of the AlN nanorods is controlled to be 320 nm, 500 nm, 600 nm, and 900 nm, while a diameter of the AlN nanorods is maintained to be approximately 620 nm by adjusting a dry etching time and a flow rate of $Cl_2$/Ar gas.

Figure 11:
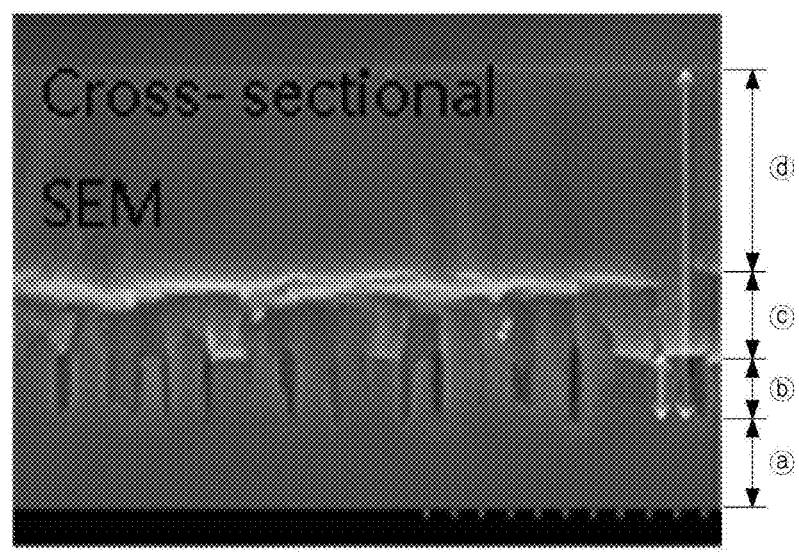
FIG. 11 is an SEM picture obtained by imaging a product in which AlN was regrown on nanorods.

As illustrated in FIG. 11, AlN (ⓒ+ⓓ) was regrown on a porous AlN layer ⓓ disposed on a sapphire substrate ⓐ using metalorganic chemical vapor deposition (MOCVD). In more detail, the regrown AlN is merged from upper surfaces of the nanorods using an epitaxial lateral growth (ELO) process to obtain a planarized AlN layer ⓒ, thereby forming a high-quality AlN layer ⓓ through an additional regrowth. In such a regrowth process, heights of voids between the nanorods may be slightly reduced. Because the AlN formed between the nanorods were merged with each other to ease strain, cracks that may be generated in a crystal growth process can be effectively inhibited.

Figure 12:
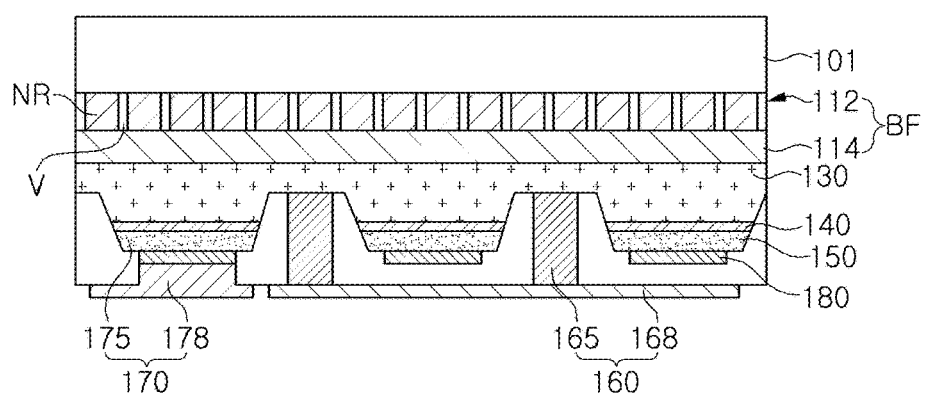
FIG. 12 is a cross-sectional view illustrating a semiconductor light emitting device according to an exemplary embodiment.

FIG. 12 is a cross-sectional view illustrating a semiconductor light emitting device according to an exemplary embodiment.

Referring to FIG. 12, a semiconductor light emitting device 100 may include a substrate 101, and a buffer layer BF, a first conductive nitride layer 130, an active layer 140, and a second conductive nitride layer 150 sequentially disposed on the substrate 101. The semiconductor light emitting device 100 may further include a first electrode 160 and a second electrode 170 connected to the first conductive nitride layer 130 and the second conductive nitride layer 150, respectively.

The substrate 101 may be a light transmitting substrate such as sapphire. The buffer layer BF may include a first buffer layer 112 and a second buffer layer 114. The first and second buffer layers 112 and 114 may be nitride layers containing Al, respectively. The buffer layer BF may include a first AlN layer 112 and a second AlN layer 114 disposed on the first AlN layer 112. While the first AlN layer 112 may include nanorods NR having a three-dimensional structure, the second AlN layer 114 may have a plate shape. The second AlN layer 114 may be disposed on the first AlN layer 112. The second AlN layer 114 may be obtained from upper surfaces of the nanorods NR by an epitaxial lateral overgrowth (ELO) process.

Hereinafter, a duplicate description regarding components referred to by the same names as the components described in FIGS. 1 and 2 will be omitted.

The first electrode 160 may include a connecting electrode portion 165 having a conductive via shape and passing through the second conductive nitride layer 150 and the active layer 140 to be connected to the first conductive nitride layer 130, and a first electrode pad 168 connected to the connecting electrode portion 165. The connecting electrode portion 165 may be surrounded by insulating portions 180 to be electrically separated from the active layer 140 and the second conductive nitride layer 150. The connecting electrode portion 165 may be properly designed in a number, a shape, a pitch, or a contact area with the first conductive nitride layer 130 in such a manner that contact resistance may be reduced. The second electrode 170 may include an ohmic contact layer 175 on the second conductive nitride layer 150 and a second electrode pad 178.

The connecting electrode portion 165 and the ohmic contact layer 175 may include a monolayer or multilayer structure formed of the first and second conductive nitride layers 130 and 150 and a conductive material having ohmic characteristics. For example, the connecting electrode portion 165 and the ohmic contact layer 175 may include at least one substance of silver (Ag), aluminum (Al), nickel (Ni), chromium (Cr), and a transparent conductive oxide (TCO).

The first and second electrode pads 168 and 178 may be connected to the connecting electrode portion 165 and the ohmic contact layer 175, respectively, to function as an external terminal of the semiconductor light emitting device 100. For example, the first and second electrode pads 168 and 178 may contain gold (Au), Ag, Al, titanium (Ti), tungsten (W), copper (Cu), tin (Sn), nickel (Ni), platinum (Pt), Cr, NiSn, TiW, AuSn or a eutectic metal thereof. The first and second electrodes 160 and 170 may be disposed in an identical direction, and may be mounted on a lead frame or the like in the form of a flip chip.

The first and second electrodes 160 and 170 may be electrically separated from each other by the insulating portions 180. The insulating portions 180 may include an insulating material, and may be formed by using a material having low light absorption. For example, the insulating portions 180 may be formed by using silicon oxide or silicon nitride, such as $SiO_2$, $SiO_xN_y$, or $Si_xN_y$. In an exemplary embodiment, the insulating portions 180 may have a light-reflective structure in which a light-reflective filler is dispersed into a light transmitting material. Alternatively, the insulating portions 180 may have a multilayer distributed Bragg reflector (DBR) structure in which a plurality of insulating layers having different refractive indexes are alternately stacked.

The semiconductor light emitting device according to the above-mentioned exemplary embodiments may be employed in various types of applications as a light source.

Figure 13:
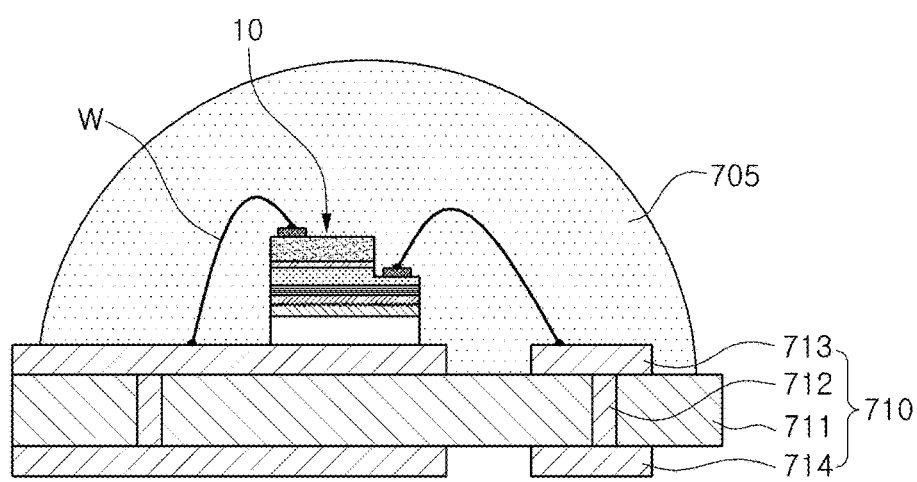
FIG. 13 is a side view illustrating a package employing the semiconductor light emitting device illustrated in FIG. 1.

FIG. 13 is a side view illustrating a package 700 employing the semiconductor ultraviolet light emitting device 10 illustrated in FIG. 1.

The semiconductor light emitting device package 700 illustrated in FIG. 13 may include the semiconductor light emitting device 10 illustrated in FIG. 1, a mounting substrate 710, and an encapsulant 705. The semiconductor light emitting device 10 may be disposed on the mounting substrate 710 to be electrically connected to the mounting substrate 710 through a wire W. The mounting substrate 710 may include a substrate body 711, an upper electrode 713, a lower electrode 714, and a through electrode 712 connecting the upper electrode 713 to the lower electrode 714. The mounting substrate 710 may be provided as a substrate such as a printed circuit board (PCB), a metal core printed circuit board (MCPCB), a metal printed circuit board (MPCB), or a flexible printed circuit board (FPCB), and a structure of the mounting substrate 710 may be applied in various forms.

The encapsulant 705 may have a dome-shaped lens structure having an upper convex surface, and adjust an orientation angle of light emitted by using a different structure.

Figure 14:
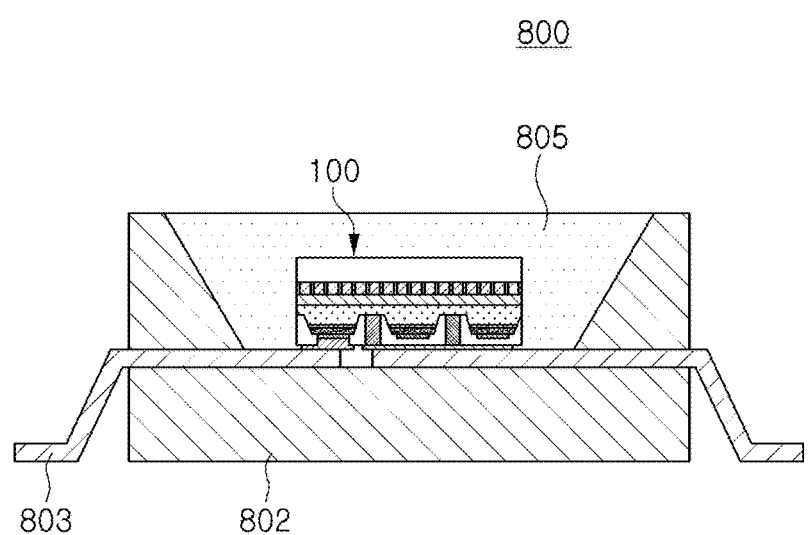
FIG. 14 is a side view illustrating a package employing the semiconductor light emitting device illustrated in FIG. 12.

FIG. 14 is a cross-sectional view illustrating a package 800 employing the semiconductor light emitting device 100 illustrated in FIG. 12.

The package 800 illustrated in FIG. 14 may include the semiconductor light emitting device 100 illustrated in FIG. 12, a package body 802, and a pair of lead frames 803.

The semiconductor light emitting device 100 may be disposed on the lead frames 803, and respective electrode pads of the semiconductor light emitting device 100 may be electrically connected to the lead frames 803 in a flip chip bonding manner. If necessary, the semiconductor light emitting device 100 may be disposed on the package body 802, for example, a region different from the lead frames 803. In addition, the package body 802 may have a groove portion having a cup shape such that light reflection efficiency may be increased, and an encapsulant 805 including a light transmitting material may be formed in the groove portion to encapsulate the semiconductor light emitting device 100.

The encapsulants 705 and 805 may include a wavelength conversion material, such as a phosphor and/or a quantum dot, if necessary. The wavelength conversion material may include various kinds of materials, such as a phosphor and/or a quantum dot.

A semiconductor ultraviolet light emitting device may be provided as a white light emitting device including a plurality of wavelength conversion elements converting light emitted from the semiconductor ultraviolet light emitting device into light having different wavelengths. For example, the semiconductor ultraviolet light emitting device may include a combination of blue and yellow phosphors or a combination of blue, green, and red phosphors.

Figure 15:
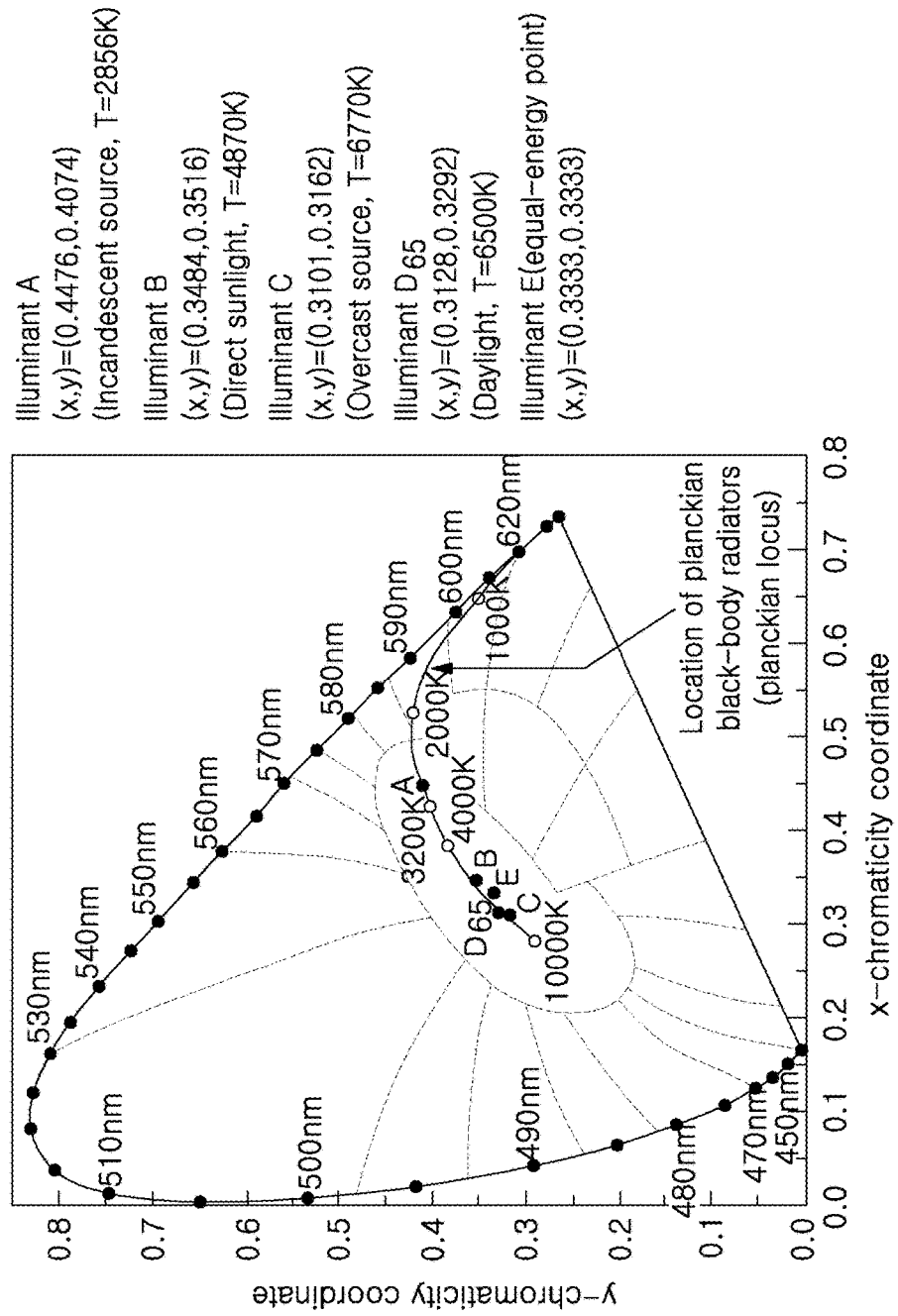
FIG. 15 is a CIE 1931 color space chromaticity diagram illustrating a wavelength conversion material employable in a semiconductor light emitting device package according to an exemplary embodiment.

FIG. 15 is a CIE 1931 color space chromaticity diagram illustrating a wavelength conversion material employable in a semiconductor light emitting device package according to an exemplary embodiment.

A single light emitting device package may allow a required color of light to be determined according to wavelengths of an LED chip that is a light emitting device, and types and mixing ratios of phosphors. This may allow a white light emitting device package to adjust a color temperature and a color rendering index.

For example, semiconductor ultraviolet light emitting devices according to the previous exemplary embodiments may implement white light by being combined with moderate phosphors among yellow, green, red, and blue phosphors, and emit white light having various color temperatures according to a mixing ratio of selected phosphors.

In this case, a lighting device may adjust a color rendering index to a sunlight level in sodium (Na) or the like, and emit various white light having a color temperature ranging from 1,500K to 2,000K. If necessary, the lighting device may emit violet, blue, green, red, and orange visible light or ultraviolet light to adjust lighting color according to device surroundings or a desired atmosphere. The lighting device may also emit light having a certain wavelength that is able to promote plant growth.

White light generated by combining a semiconductor ultraviolet light emitting device with yellow, green, red, and blue phosphors and/or green and red light emitting devices may have at least two peak wavelengths, and as illustrated in FIG. 15, (x, y) coordinates of the CIE 1931 color space chromaticity diagram may be located in an area of segments connecting coordinates: (0.4476, 0.4074), (0.3484, 0.3516), (0.3101, 0.3162), (0.3128, 0.3292), and (0.3333, 0.3333). Alternatively, (x, y) coordinates may be located in an area surrounded by the segments and a blackbody radiation spectrum. A color temperature of white light may range from 1,500K to 20,000K. In FIG. 15, white light adjacent to point E (0.3333, 0.3333) below the blackbody radiation spectrum may be used as a light source for lighting to create clearer viewing conditions for the naked eye in a state in which light having a yellow-based component is reduced. Thus, a lighting product using white light in the vicinity of the point E (0.3333, 0.3333) below the blackbody radiation spectrum may be useful as lighting for a retail space in which consumer goods are sold.

Phosphors may have the following empirical formulae and colors:

Oxide-based: yellow and green $Y_3Al_5O_{12}$:Ce, yellow and green $Tb_3Al_5O_{12}$:Ce, and yellow and green $Lu_3Al_5O_{12}$:Ce;

Silicate-based: yellow and green $(Ba,Sr)_2SiO_4$:Eu and yellow and orange $(Ba,Sr)_3SiO_5$:Ce;

Nitride-based: green β-SiAlON:Eu, yellow $La_3Si_6N_{11}$:Ce, orange α-SiAlON:Eu, red $CaAlSiN_3$:Eu, red $Sr_2Si_5N_8$:Eu, red $SrSiAl_4N_7$:Eu, and red $SrLiAl_3N_4$:Eu $Ln_{4-x}(Eu_zM_{1-z})_xSi_{12-y}Al_yO_{3+x+y}N_{18-x-y}$, where 0.5≤x≤3, 0<z<0.3, 0<y≤4 (here, Ln may be at least one type of element selected from the group consisting of group IIIa elements and rare earth elements, and M may be at least one type of element selected from the group consisting of Calcium (Ca), Barium (Ba), Strontium (Sr) and Magnesium (Mg)); and Fluoride-based: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, and $K_3SiF_7$:$Mn^{4+}$.

Phosphor compositions should basically conform with stoichiometry, and respective elements may be substituted with different elements of each groups on the periodic table. For example, Strontium (Sr) may be substituted with Barium (Ba), Calcium (Ca), Magnesium (Mg), and the like of an alkaline earth group II, and yttrium (Y) may be substituted with Terbium (Tb), Lutetium (Lu), Scandium (Sc), Gadolinium (Gd), and the like of lanthanide. In addition, Europium (Eu) or the like, an activator, may be substituted with Cerium (Ce), Terbium (Tb), Praseodymium (Pr), Erbium (Er), Ytterbium (Yb), and the like according to required energy levels. An activator may be applied alone, or an additional sub-activator or the like may be additionally applied to modify characteristics.

Table 1 below indicates application-specific phosphor types of a white light emitting device using an ultraviolet (UV) LED chip (about 200 nm to 430 nm).

TABLE 1

| USE | PHOSPHOR |
|---|---|
| LED TV BACK LIGHT UNIT (BLU) | β-SiAlON:$Eu^{2+}$, (Ca, Sr)AlSiN$_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |
| LIGHTING | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |

TABLE 1-continued

| USE | PHOSPHOR |
|---|---|
| SIDE VIEW (MOBILE, LAPTOP COMPUTER) | $Lu_3Al_5O_{12}:Ce^{3+}$, Ca-α-SiAlON:$Eu^{2+}$, $La_3Si_6N_{11}:Ce^{3+}$, (Ca, Sr)AlSiN$_3$:$Eu^{2+}$, $Y_3Al_5O_{12}:Ce^{3+}$, (Sr, Ba, Ca, Mg)$_2$SiO$_4$:$Eu^{2+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, NaYF$_4$:$Mn^{4+}$, NaGdF$_4$:$Mn^{4+}$ |
| ELECTRONIC DEVICE (HEAD LAMP, ETC.) | $Lu_3Al_5O_{12}:Ce^{3+}$, Ca-α-SiAlON:$Eu^{2+}$, $La_3Si_6N_{11}:Ce^{3+}$, (Ca, Sr)AlSiN$_3$:$Eu^{2+}$, $Y_3Al_5O_{12}:Ce^{3+}$, $K_2SiF_6$:$Mn^{4+}$, SrLiAl$_3$N$_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, NaYF$_4$:$Mn^{4+}$, NaGdF$_4$:$Mn^{4+}$ |

In addition, a wavelength conversion material such as a quantum dot (QD) may be used to replace a phosphor or to be mixed with a phosphor. The QD may implement various colors according to sizes, and in particular, when used as a phosphor alternative, the QD may be employed as a red or green phosphor. By using a QD, a full width at half maximum (for example, about 35 nm) may be implemented.

The wavelength conversion material may be contained in an encapsulant. In a different manner, the wavelength conversion material may be previously manufactured in the form of a film and may be attached to a surface of an optical structure, such as a semiconductor light emitting device or a light guide plate. In this case, the wavelength conversion material may be readily applied to a required region of a structure having a uniform thickness.

Figure 16:
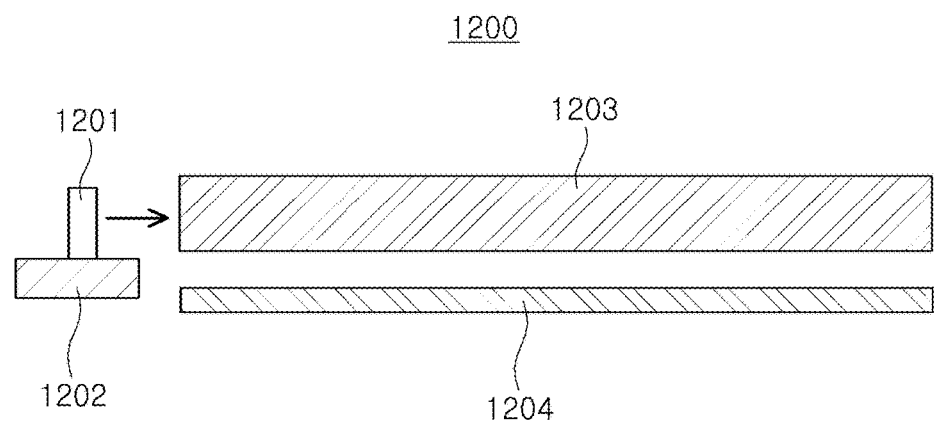
FIG. 16 is a cross-sectional view of an edge type backlight unit employing a semiconductor light emitting device according to an exemplary embodiment.
Figure 17:
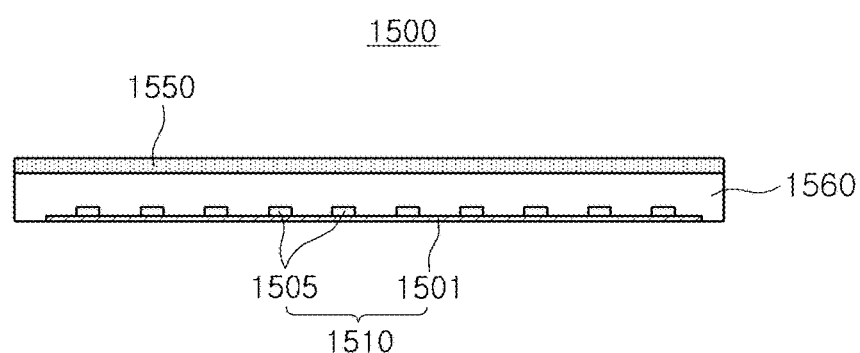
FIG. 17 is a cross-sectional view of a direct type backlight unit employing a semiconductor light emitting device according to an exemplary embodiment.
Figure 18:
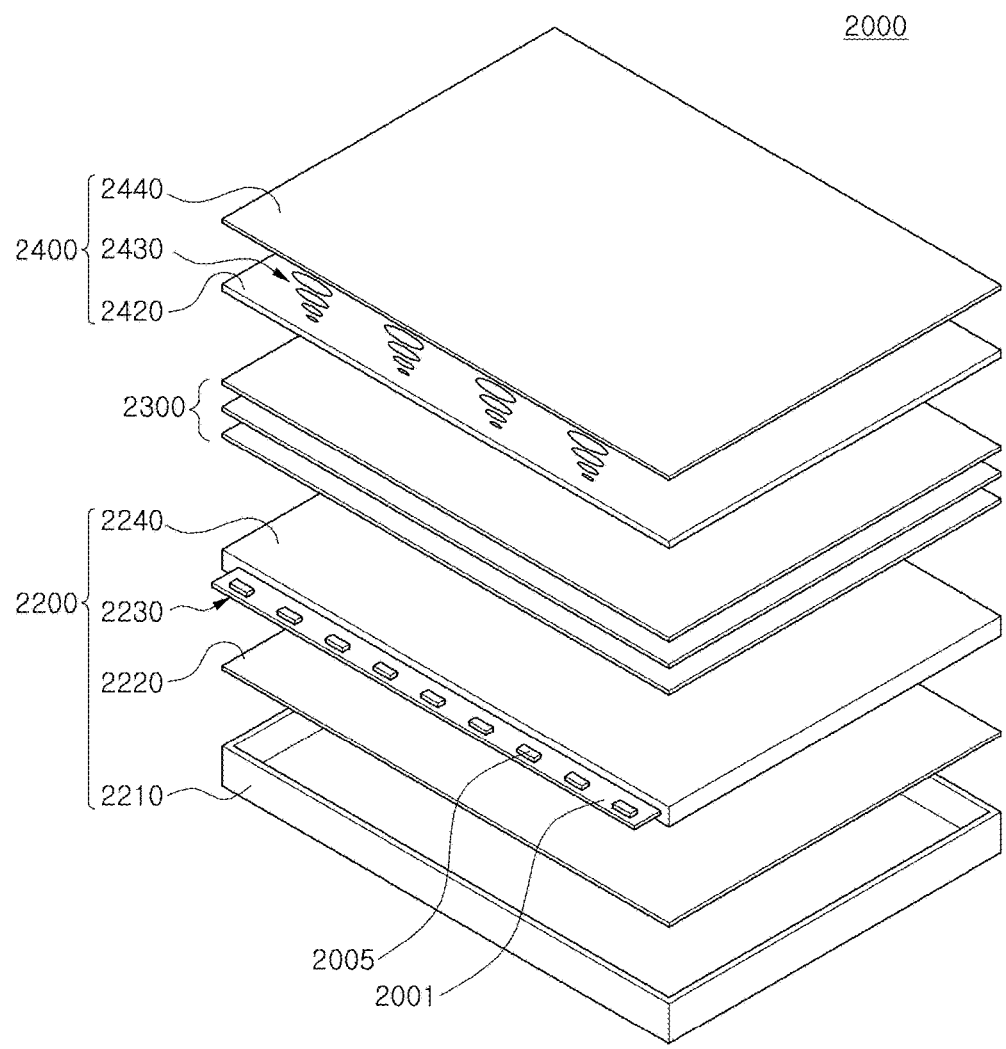
FIG. 18 is an exploded perspective view of a display device employing a semiconductor light emitting device according to an exemplary embodiment.

The wavelength conversion material may be advantageously used in various light source devices, such as a backlight unit or a display device. FIGS. 16 and 17 are cross-sectional views respectively illustrating backlight units according to exemplary embodiments, and FIG. 18 is an exploded perspective view illustrating a display device according to an exemplary embodiment.

Referring to FIG. 16, a backlight unit 1200 may include a light guide plate 1203, and a circuit board 1202 disposed on a side surface of the light guide plate 1203 and having a plurality of light sources 1201 mounted thereon. A reflective layer 1204 may be disposed below the light guide plate 1203 of the backlight unit 1200.

The light sources 1201 may radiate light to the side surface of the light guide plate 1203, and the light may be incident on an inside of the light guide plate 1203 to be emitted above the light guide plate 1203. A backlight device according to the exemplary embodiment may also be referred to as an "edge-type backlight unit." Each of the light sources 1201 may include the aforementioned semiconductor light emitting device or semiconductor light emitting device package including the same, together with a wavelength conversion material. For example, the light source 1201 may be the semiconductor light emitting device packages 700 or 800.

Referring to FIG. 17, a direct-type backlight unit such as a backlight unit 1500 may include a wavelength converter 1550, a light source module 1510 arranged below the wavelength converter 1550, and a bottom case 1560 accommodating the light source module 1510. The light source module 1510 may include a printed circuit board (PCB) 1501 and a plurality of light sources 1505 disposed on an upper surface of the PCB 1501. The light sources 1505 may be the aforementioned semiconductor light emitting device or the semiconductor light emitting device package including the same. The light source may not be used with a wavelength conversion material.

The wavelength converter 1550 may be appropriately selected to emit white light according to wavelengths of the light sources 1505. The wavelength converter 1550 may be manufactured as a separate film for use, or may be integrated with another optical element, such as a separate light diffusion plate. As such, in the exemplary embodiment, the wavelength converter 1550 may be disposed to be spaced apart from the light sources 1505 so that deterioration of reliability of the wavelength converter 1550 caused by heat emitted from the light sources 1505 may be reduced.

FIG. 18 is a schematic exploded perspective view of a display device according to an exemplary embodiment.

Referring to FIG. 18, a display device 2000 may include a backlight unit 2200, optical sheets 2300, and an image display panel 2400, such as a liquid crystal display panel.

The backlight unit 2200 may include a bottom case 2210, a reflector 2220, a light guide plate 2240, and a light source module 2230 provided on at least one side surface of the light guide plate 2240. The light source module 2230 may include a printed circuit board (PCB) 2001 and light sources 2005, and the light sources 2005 may be the aforementioned semiconductor light emitting device or the semiconductor light emitting device package including the same. The light sources 2005 may be a side view-type light emitting device disposed on a side surface adjacent to a light emitting surface. According to an exemplary embodiment, the backlight unit 2200 may be replaced by one of the backlight units 1200 and 1500 of FIGS. 16 and 17.

The optical sheets 2300 may be disposed between the light guide plate 2240 and the image display panel 2400, and include various types of sheets, such as a diffusion sheet, a prism sheet, and a protection sheet.

The image display panel 2400 may display an image using light emitted through the optical sheets 2300. The image display panel 2400 may include an array substrate 2420, a liquid crystal layer 2430, and a color filter substrate 2440. The array substrate 2420 may include pixel electrodes disposed in a matrix, thin film transistors applying a driving voltage to the pixel electrodes, and signal lines operating the thin film transistors. The color filter substrate 2440 may include a transparent substrate, a color filter, and a common electrode. The color filter may include filters selectively passing light having a certain wavelength of white light emitted from the backlight unit 2200. The liquid crystal layer 2430 may be re-arranged by an electric field generated between the pixel electrodes and the common electrode to adjust light transmittance. Light with adjusted light transmittance may be projected to display an image by passing the color filter of the color filter substrate 2440. The image display panel 2400 may further include a driving circuit unit processing an image signal.

Figure 19:
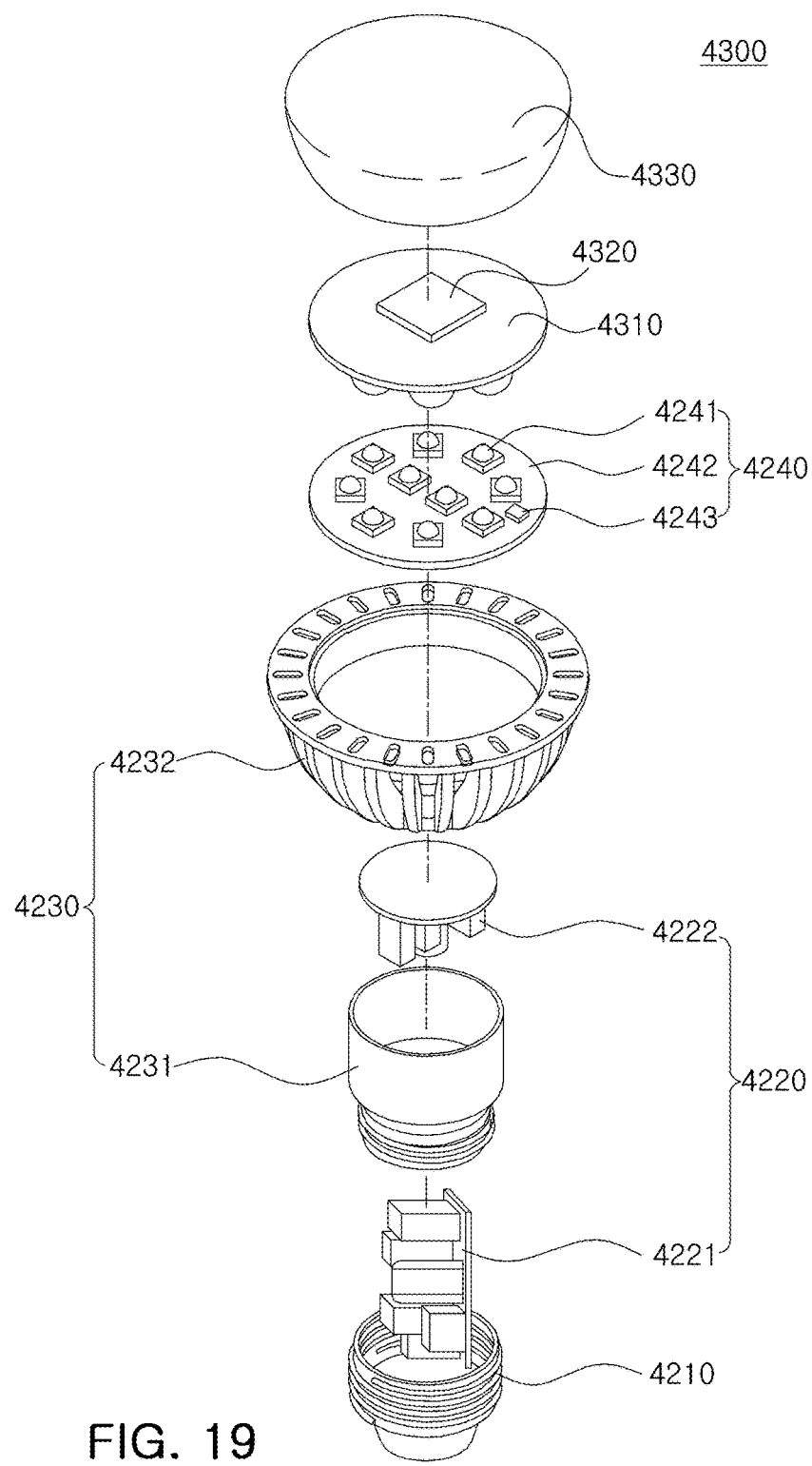
FIG. 19 is an exploded perspective view of a lighting device including a semiconductor light emitting device according to an exemplary embodiment.

FIG. 19 is an exploded perspective view of a lighting device employing a semiconductor light emitting device according to an exemplary embodiment.

Referring to FIG. 19, a lighting device 4300 may include a socket 4210, a power supply 4220, a heat sink 4230, and a light source module 4240. According to the example, the light source module 4240 may include a light emitting device array, and the power supply 4220 may include a light emitting device driver.

The socket 4210 may be configured to replace that of a conventional lighting device. Power supplied to the lighting device 4300 may be applied through the socket 4210. As illustrated in FIG. 19, the power supply 4220 may include a first power supply unit 4221 and a second power supply unit 4222. The heat sink 4230 may include an internal sink 4231 and an external sink 4232. The internal heat sink 4231 may be directly connected to the light source module 4240 and/or the power supply 4220. Such a connection may allow heat to be transferred to the external heat sink 4232.

The light source module 4240 may receive power from the power supply 4220 to emit light to an optical portion. The light source module 4240 may include light sources 4241, a circuit board 4242, and a controller 4243, and the controller 4243 may store driving information of the light sources 4241. The light sources 4241 may be the aforementioned semiconductor light emitting device or the semiconductor light emitting device package including the same.

The light source module 4240 may include a reflector 4310 provided thereabove, and reduce glare by evenly diffusing light emitted from the light sources 4241 to a side surface and rear of the reflector 4310. In addition, the reflector 4310 may include a communications module 4320 mounted thereon, and perform home network communications through the communications module 4320. For example, the communications module 4320 may include a wireless communications module using Zigbee® Wi-Fi, or Li-Fi, and control on/off functions and brightness of a lighting device installed in and around the home through a smartphone or wireless controller. Further, use of a Li-Fi communications module using a visible light wavelength of a lighting apparatus installed in and around residential, commercial, or industrial spaces may control electronics, such as a TV, a refrigerator, an air-conditioner, a door lock, or may control a vehicle. The reflector 4310 and the communications module 4320 may be covered with a cover 4330.

Figure 20:
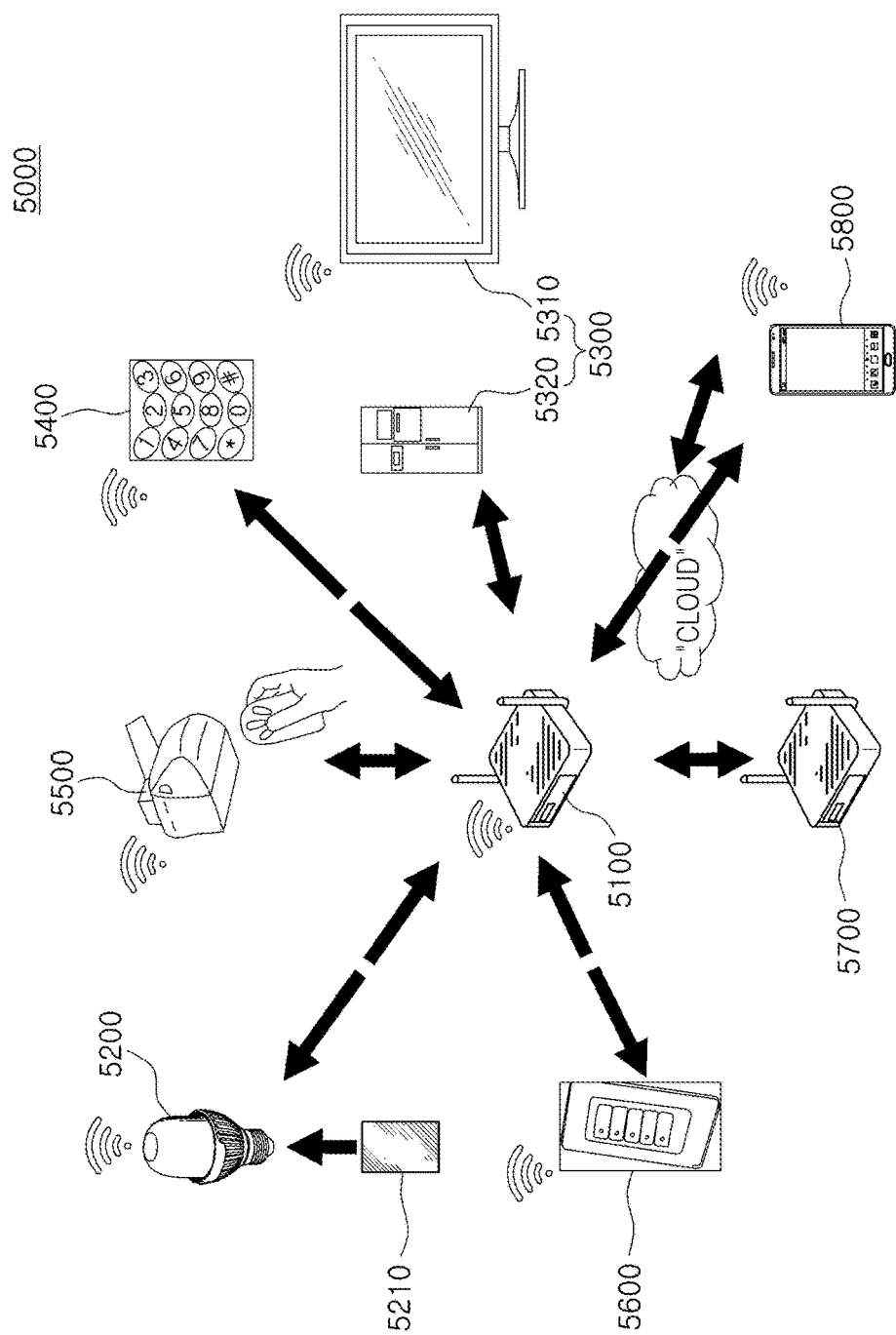
FIG. 20 is a schematic diagram illustrating an indoor lighting control network system.

FIG. 20 is a schematic diagram illustrating an indoor lighting control network system.

A network system 5000 according to an exemplary embodiment may be a complex smart lighting-network system in which lighting technology, Internet of Things (IoT) technology, wireless communications technology, and the like using a light emitting device, such as the aforementioned semiconductor ultraviolet light emitting device, are combined with each other. The network system 5000 may be implemented by using various lighting devices and wired and wireless communications devices, and may be realized by sensors, controllers, communications units, software for network control and maintenance, and the like.

The network system 5000 may be applied to an open space, such as a park or a street, as well as a closed space defined in a building, such as home or office. The network system 5000 may be implemented on the basis of an Internet of things (IoT) environment so as to collect and process various pieces of information and provide the collected and processed information to a user. At this time, an LED lamp 5200 included in the network system 5000 may function to check and control operational states of other devices 5300-5800 included in the IoT environment on the basis of a function of the LED lamp 5200, such as visible light communications or the like, as well as information about surroundings received from a gateway 5100 to control lighting of the LED lamp 5200 itself.

Referring to FIG. 20, the network system 5000 may include the gateway 5100 processing data transmitted and received according to different communication protocols, the LED lamp 5200 connected to the gateway 5100 to communicate therewith and including the aforementioned semiconductor ultraviolet light emitting device, and the plurality of devices 5300-5800 connected to the gateway 5100 to communicate therewith according to various wireless communications methods. In order to implement the network system 5000 on the basis of the IoT environment, the respective devices 5300-5800 and the LED lamp 5200 may include at least one communications module. In an exemplary embodiment, the LED lamp 5200 may be connected to the gateway 5100 to communicate therewith by wireless communications protocols, such as Wi-Fi, Zigbee®, and Li-Fi. To this end, the LED lamp 5200 may have at least one communications module 5210 for a lamp.

As described above, the network system 5000 may be applied to an open space, such as a park or a street, as well as a closed space, such as a home or an office (residential or commercial space). When the network system 5000 is applied to a home, the plurality of devices 5300-5800 included in the network system 5000 and connected to the gateway 5100 to communicate therewith on the basis of IoT technology may include a home appliance 5300, such as a television 5310 or a refrigerator 5320, a digital door lock 5400, a garage door lock 5500, a lighting switch 5600 installed on a wall or the like, a router 5700 for wireless network relay, and a mobile device 5800, such as a smartphone, a tablet PC, or a laptop PC.

In the network system 5000, the LED lamp 5200 may check operational states of the various devices 5300-5800 using wireless communications networks (Zigbee® Wi-Fi, Li-Fi, and the like) installed in home or may automatically control luminance of the LED lamp 5200 itself according to surroundings and situations. Li-Fi communications using visible light emitted from the LED lamp 5200 may control the devices 5300-5800 included in the network system 5000.

First, the LED lamp 5200 may automatically control the luminance of the LED lamp 5200 on the basis of surrounding information transmitted from the gateway 5100 through the communications module for the lamp 5210, or surrounding information collected by a sensor mounted in the LED lamp 5200. For example, brightness of the LED lamp 5200 may be automatically controlled according to a type of a program being broadcasted on the television 5310 or brightness of an image. To this end, the LED lamp 5200 may receive operation information of the television 5310 from the communications module for the lamp 5210 connected to the gateway 5100. The communications module for the lamp 5210 may be integrally modularized with a sensor and/or a controller.

For example, when a value of a program being broadcasted corresponds to a drama, a light may be controlled to have a reduced color temperature less than or equal to 12,000K, such as 5,000K, according to predetermined settings to control colors, thereby creating a cozy atmosphere. In a different manner, when a value of a program corresponds to a comedy, the network system 5000 may be configured in such a manner that a light may be controlled to have an increased color temperature of 5,000K or more and to be blue-based white lighting according to predetermined settings.

When a certain period of time passes after the digital door lock 5400 is locked while there is no person in a home, all the LED lamps 5200 turned on may be turned off, and thus a waste of electricity may be prevented. Alternatively, when a security mode is set by the mobile device 5800 or the like, if the digital door lock 5400 is locked while there is no person in a home, the LED lamp 5200 may be kept turned on.

Operation of the LED lamp 5200 may be controlled according to surrounding information collected by various sensors connected to the network system 5000. For example, when the network system 5000 is implemented in a building, a light, a position sensor, and a communications module are combined with each other in the building to collect information on locations of people in the building so that the light may be turned on or off, or the collected information may be provided in real time, thereby enabling facility management or efficient use of an idle space. In general, since a lighting device such as the LED lamp 5200 is disposed in almost all of the spaces on each floor of a building, various pieces of information in the building may be collected by a sensor integrated with the LED lamp 5200, and the collected information may be used to manage facilities or utilize an idle space.

Meanwhile, combining the LED lamp 5200 with an image sensor, a storage, the communications module for the lamp 5210, and the like may allow the LED lamp 5200 to be utilized as a device that may maintain building security or detect an emergency and deal with it. For example, when a smoke or temperature sensor is attached to the LED lamp 5200, the LED lamp 5200 may detect whether a fire or the like occurs, thereby minimizing damage, and may also control brightness of lighting considering external weather or sunlight, thereby saving energy and providing a comfortable lighting environment.

Figure 21:
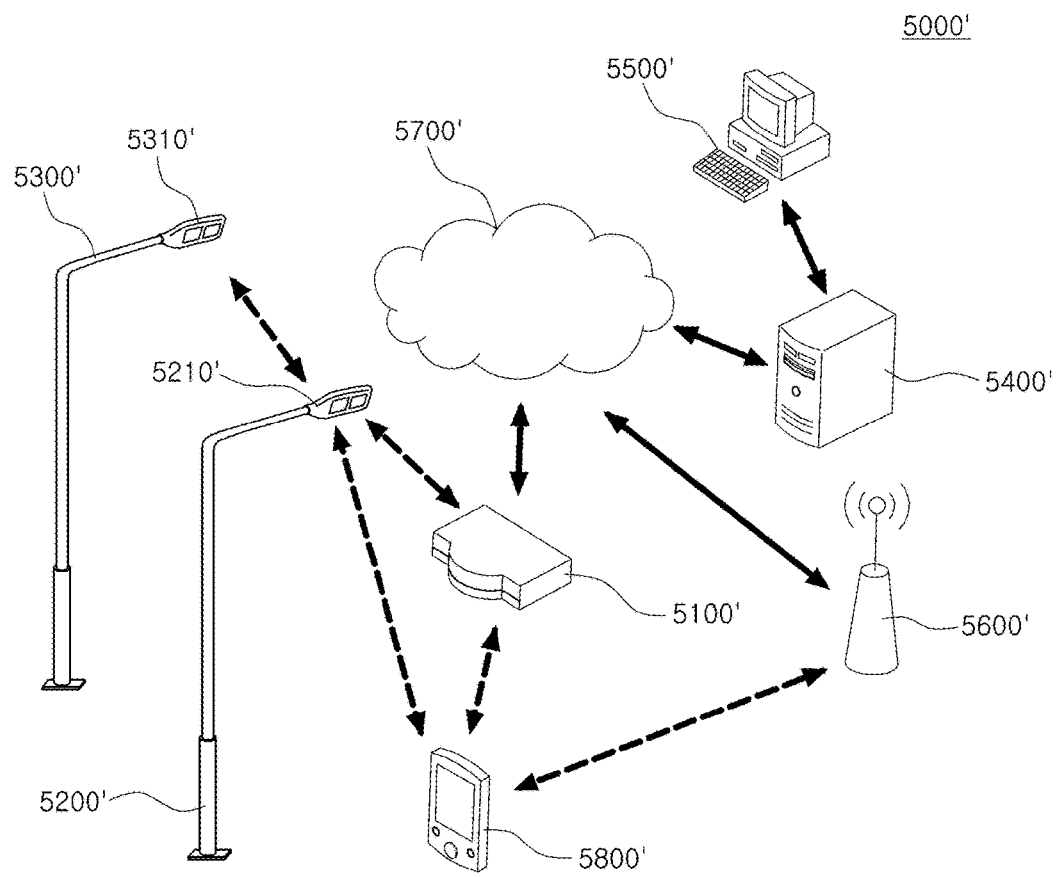
FIG. 21 illustrates an example of a network system applied to an open space.

FIG. 21 illustrates an example of a network system applied to an open space.

Referring to FIG. 21, a network system 5000' according to an exemplary embodiment may include a communications connection device 5100', a plurality of lighting fixtures 5200' and 5300' installed at predetermined intervals and connected to the communications connection device 5100' to communicate therewith, a server 5400', a computer 5500' managing the server 5400', a communications base station 5600', a communications network 5700' connecting the communicable devices, a mobile device 5800', and the like.

The plurality of lighting fixtures 5200' and 5300' installed in an open external space, such as a street or a park, may include smart engines 5210' and 5310', respectively. Each of the smart engines 5210' and 5310' may include a sensor collecting information about surroundings, a communications module, and the like, in addition to a light emitting device emitting light and a driver driving the light emitting device. The communications module may allow the smart engines 5210' and 5310' to communicate with other surrounding devices according to communications protocols such as Wi-Fi, Zigbee® and Li-Fi.

For example, a smart engine 5210' may be connected to the other smart engine 5310' to communicate therewith. At this time, Wi-Fi extension technology (Wi-Fi mesh) may be applied to communications between the smart engines 5210' and 5310'. At least one smart engine 5210' may be connected to the communications connection device 5100' linked to the communications network 5700' through wired and/or wireless communications. In order to increase communications efficiency, several smart engines 5210' and 5310' may be grouped into one to be connected to a communications connection device 5100'.

The communications connection device 5100' may relay communications between the communications network 5700' and another device, as an access point (AP) that enables wired and/or wireless communications. The communications connection device 5100' may be connected to the communications network 5700' by at least one of wired and wireless methods, and may be mechanically accommodated in one of the lighting fixtures 5200' and 5300'.

The communications connection device 5100' may be connected to the mobile device 5800' through a communications protocol, such as Wi-Fi. A user of the mobile device 5800' may receive information about surroundings collected by the plurality of smart engines 5210' and 5310' through the communications connection device 5100' connected to the smart engine 5210' of the adjacent surrounding lighting fixture 5200'. The surrounding information may include surrounding traffic information, weather information, and the like. The mobile device 5800' may be connected to the communications network 5700' by a wireless cellular communications method, such as 3G or 4G.

Meanwhile, the server 5400' connected to the communications network 5700' may monitor operational states or the like of the respective lighting fixtures 5200' and 5300' while receiving information collected by the smart engines 5210' and 5310' respectively mounted in the lighting fixtures 5200' and 5300'. In order to manage the respective lighting fixtures 5200' and 5300' according to the monitoring results of operational states of the respective lighting fixtures 5200' and 5300', the server 5400' may be connected to the computer 5500' providing a management system. The computer 5500' may execute software or the like able to monitor and manage operational states of the respective lighting fixtures 5200' and 5300', particularly the smart engines 5210' and 5310'.

Figure 22:
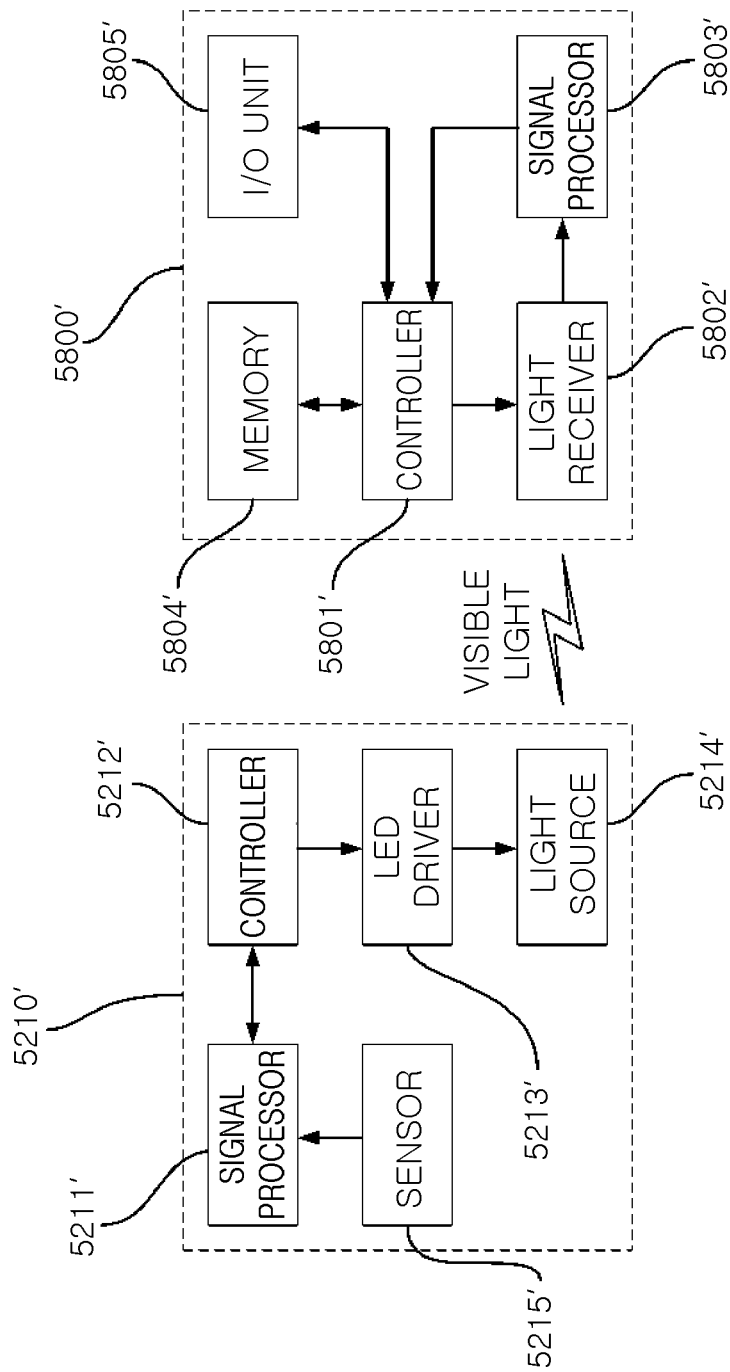
FIG. 22 is a block diagram illustrating a communications operation between a smart engine of a lighting apparatus and a mobile device by visible light communications.

FIG. 22 is a block diagram illustrating a communications operation between a smart engine of a lighting fixture and a mobile device by visible light communications.

Referring to FIG. 22, the smart engine 5210' may include a signal processor 5211', a controller 5212', an LED driver 5213', a light source 5214', a sensor 5215'. The mobile device 5800' connected to the smart engine 5210' by visible light communications may include a controller 5801', a light receiver 5802', a signal processor 5803', a memory 5804', and an I/O (Input/Output) unit 5805'.

Visible light communications technology, such as light fidelity (Li-Fi), may be used to wirelessly transmit information using light in the visible spectrum that can be recognized by the human eye. The visible light communications technology may be distinguished from conventional wired optical communications technology and wireless infrared light communications in terms of using light in a visible spectrum, that is, a certain visible light frequency from the semiconductor light emitting device package described in the exemplary embodiment, and may be differentiated from wired optical communications technology in terms of a wireless communications environment. The visible light communications technology may also be convenient in that the visible light communications technology may be freely used without being restricted or permitted in terms of use of frequency, unlike radio frequency (RF) wireless communications, may be distinctive in that physical security is excellent and a user may be able to see a communications link with the naked eye, and, principally, may have a characteristic of convergence technology that a unique purpose and a communications function of a light source may be simultaneously obtained.

The signal processor 5211' of the smart engine 5210' may process data that is desired to be transmitted and received by visible light communications. For example, the signal processor 5211' may process information collected by the sensor 5215' into data and transmit the data to the controller 5212'. The controller 5212' may control operations of the signal processor 5211', the LED driver 5213', and the like, and particularly, may control an operation of the LED driver 5213' on the basis of data transmitted from the signal processor 5211'. The LED driver 5213' may transmit data to the mobile device 5800' by allowing the light source 5214' to emit light in response to a control signal transmitted from the controller 5212'.

The mobile device 5800' may include the light receiver 5802' recognizing visible light including data in addition to the controller 5801', the memory 5804' storing data, the I/O unit 5805' including a display, a touch screen, an audio output unit, and the like, and the signal processor 5803'. The light receiver 5802' may detect visible light and convert the detected visible light into an electrical signal, and the signal processor 5803' may decode data included in the electrical signal converted by the light receiver 5802'. The controller 5801' may store the data decoded by the signal processor 5803' in the memory 5804' or output the decoded data through the I/O unit 5805' or the like in such a manner that a user may recognize the decoded data.

As set forth above, according to exemplary embodiments, in a process of forming a nitride buffer layer containing Al, a high-quality buffer layer may be provided by regrowing AlN on nanostructures, such as nanorods, arranged at small intervals. In addition, an air gap may be provided as a gap between the nanostructures, and thus light extraction efficiency may be improved. By adjusting sizes and arrangements of the nanostructures, light extraction efficiency may be significantly increased.

While exemplary embodiments have been shown and described above, it will be apparent to those skilled in the art that modifications and variations could be made without departing from the scope of the inventive concept as defined by the appended claims.

What is claimed is:

1. A semiconductor ultraviolet light emitting device comprising:
    a substrate;
    a buffer layer disposed on the substrate and comprising a plurality of nanorods between which a plurality of voids are formed;
    a first conductive nitride layer disposed on the buffer layer and having a first conductive AlGaN layer;
    an active layer disposed on the first conductive nitride layer and having a quantum well including $Al_xIn_yGa_{1-x-y}N$ ($0 \leq x+y \leq 1$, $0 \leq y < 0.15$); and
    a second conductive nitride layer disposed on the active layer and having a second conductive AlGaN layer,
    wherein the plurality of nanorods satisfy $3.5 \leq n(\lambda) \times D/\lambda \leq 5.0$, where $\lambda$ represents a wavelength of light generated by the active layer, $n(\lambda)$ represents a refractive index of the plurality of nanorods at a wavelength of $\lambda$, and D represents diameters of the plurality of nanorods.

2. The semiconductor ultraviolet light emitting device of claim 1, wherein the buffer layer comprises:
    a first aluminum nitride (AlN) layer having the plurality of nanorods arranged on the substrate; and
    a second AlN layer disposed on the first AlN layer comprising the voids formed between the plurality of nanorods.

3. The semiconductor ultraviolet light emitting device of claim 2, wherein the first AlN layer further comprises an AlN film on the substrate, and the plurality of nanorods are arranged on the AlN film.

4. The semiconductor ultraviolet light emitting device of claim 2, wherein the second AlN layer is obtained from upper surfaces of the nanorods by an epitaxial lateral overgrowth (ELO) process, and the voids formed between the plurality of nanorods are maintained to be empty.

5. The semiconductor ultraviolet light emitting device of claim 2, wherein the first AlN layer includes nanorods having a three-dimensional structure, and the second AlN layer is a plate shape.

6. The semiconductor ultraviolet light emitting device of claim 1, wherein the plurality of nanorods are arranged to contact an upper surface of the substrate.

7. The semiconductor ultraviolet light emitting device of claim 1, wherein the wavelength $\lambda$ of light generated by the active layer ranges from about 250 nm to 300 nm.

8. The semiconductor ultraviolet light emitting device of claim 7, wherein the diameters D of the plurality of nanorods range from about 450 nm to 650 nm.

9. The semiconductor ultraviolet light emitting device of claim 7, wherein heights H of the plurality of nanorods range from about 200 nm to 2 µm.

10. The semiconductor ultraviolet light emitting device of claim 7, wherein pitches P of the plurality of nanorods are greater than or equal to the diameters D of the nanorods, and less than about 3 µm.

11. The semiconductor ultraviolet light emitting device of claim 7, wherein an interval d between two adjacent nanorods is less than about 200 nm.

12. The semiconductor ultraviolet light emitting device of claim 1, wherein the plurality of nanorods are arranged in a hexagonal closet packing (HCP) arrangement.

13. The semiconductor ultraviolet light emitting device of claim 1, wherein the quantum well comprises a plurality of quantum well layers including $Al_{x1}Ga_{1-x1}N$ ($0 < x1 < 1$), and the active layer comprises the plurality of quantum well layers and a plurality of quantum barrier layers including $Al_{x2}Ga_{1-x2}N$ ($x1 < x2 < 1$), which are alternately stacked.

* * * * *